United States Patent [19]
Tsuruno et al.

[11] Patent Number: 5,332,969
[45] Date of Patent: Jul. 26, 1994

[54] MAGNETIC RESONANCE IMAGING METHOD AND APPARATUS CAPABLE OF COMPENSATING FOR DISTURBED GRADIENT FIELD CAUSED BY EDDY CURRENT

[75] Inventors: Daihachirou Tsuruno; Hiromi Kawamoto; Motohiro Miura, all of Tochigiken, Japan

[73] Assignee: Kabushiki Kaisha Toshiba, Kanagawa, Japan

[21] Appl. No.: 948,152

[22] Filed: Sep. 18, 1992

[30] Foreign Application Priority Data

Sep. 19, 1991 [JP] Japan ................. 3-239829

[51] Int. Cl.$^5$ ............................................. G01R 33/20
[52] U.S. Cl. .................................................... 324/309
[58] Field of Search .................. 324/300, 307, 309, 310, 324/311, 312, 313, 314, 318, 322

[56] References Cited

U.S. PATENT DOCUMENTS

| | | | |
|---|---|---|---|
| 4,678,996 | 7/1987 | Haacke et al. | 324/309 |
| 4,680,545 | 7/1987 | Gray et al. | 324/309 |
| 4,864,241 | 9/1989 | Goldie | 324/318 |
| 5,016,638 | 5/1991 | Hsieh | 324/300 |

FOREIGN PATENT DOCUMENTS

| | | |
|---|---|---|
| 0164199 | 4/1985 | European Pat. Off. . |
| 0412394A3 | 8/1990 | European Pat. Off. . |
| 3732660A1 | 7/1988 | Fed. Rep. of Germany . |

OTHER PUBLICATIONS

P. Jehenson, M. Westphal, N. Schuff, "Analytical Method for the Compensation of Eddy-Current Effects Induced by Pulsed Magnetic Field Gradient in NMR Systems", Jour. of Magnetic Resonance, vol. 90, No. 2, Nov. 1, 1990, pp. 264–278.

J. J. Van Vaals, et al., "Optimization of Eddy-Current Compensation", Journal of Magnetic Resonance, vol. 90, No. 1, Oct. 15, 1990, pp. 52–90.

*Primary Examiner*—Michael J. Tokar
*Attorney, Agent, or Firm*—Limbach & Limbach

[57] ABSTRACT

In an MR (magnetic resonance) imaging method, not only eddy current field is compensated, but also a gradient field vibrated by a mechanical vibration caused by the eddy current is compensated. The method for imaging a biological body under medical examination by utilizing a magnetic resonance phenomenon under influence of a static magnetic field and a gradient magnetic field to acquire an MR image of a preselected slice portion within the biological body, comprising the steps of: producing a first drive current on which an eddy current field compensating current has been superimposed: producing a vibrating-field compensating current for compensating a gradient field vibrated by the eddy current; and superimposing the vibrating-field compensating current on the first drive current to obtain a second drive current. The second drive current is supplied to a gradient coil assembly for generating a gradient field whose vibrating field component has been compensated.

17 Claims, 30 Drawing Sheets

3rd FIELD VIBRATION COMPENSATING UNIT 18₃

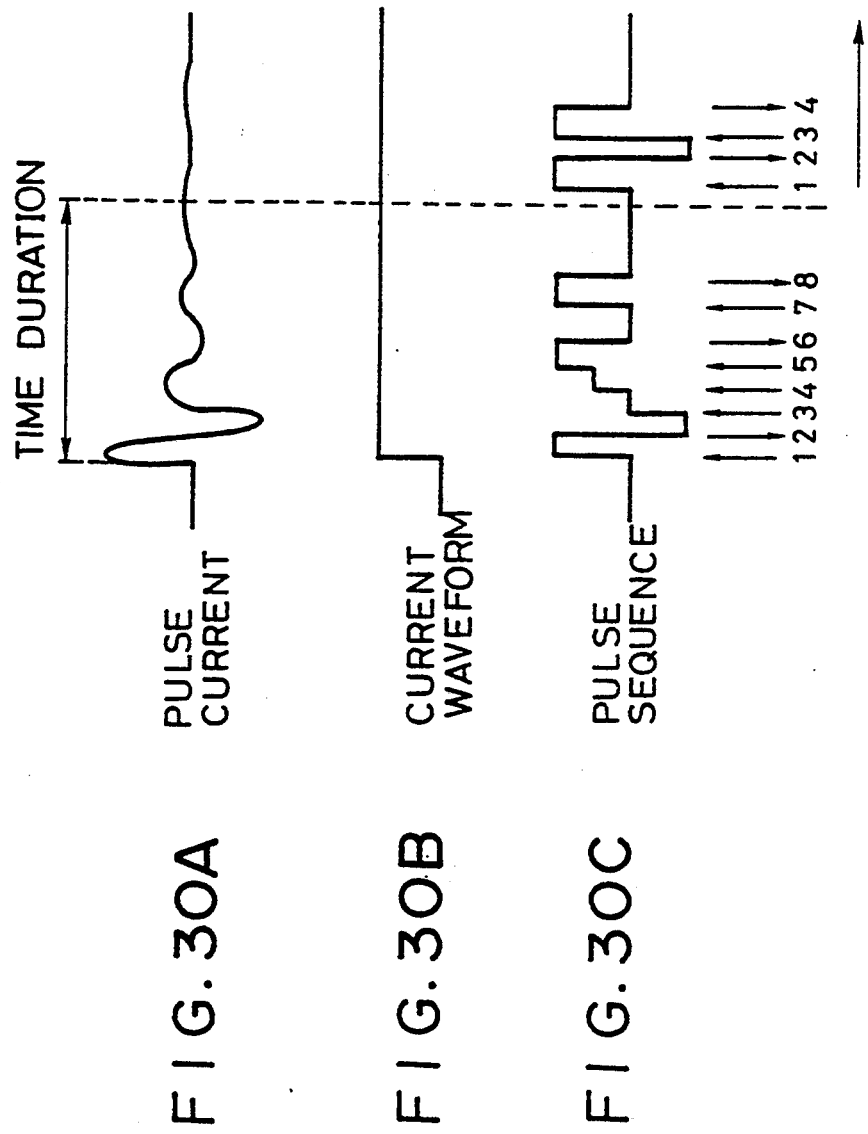

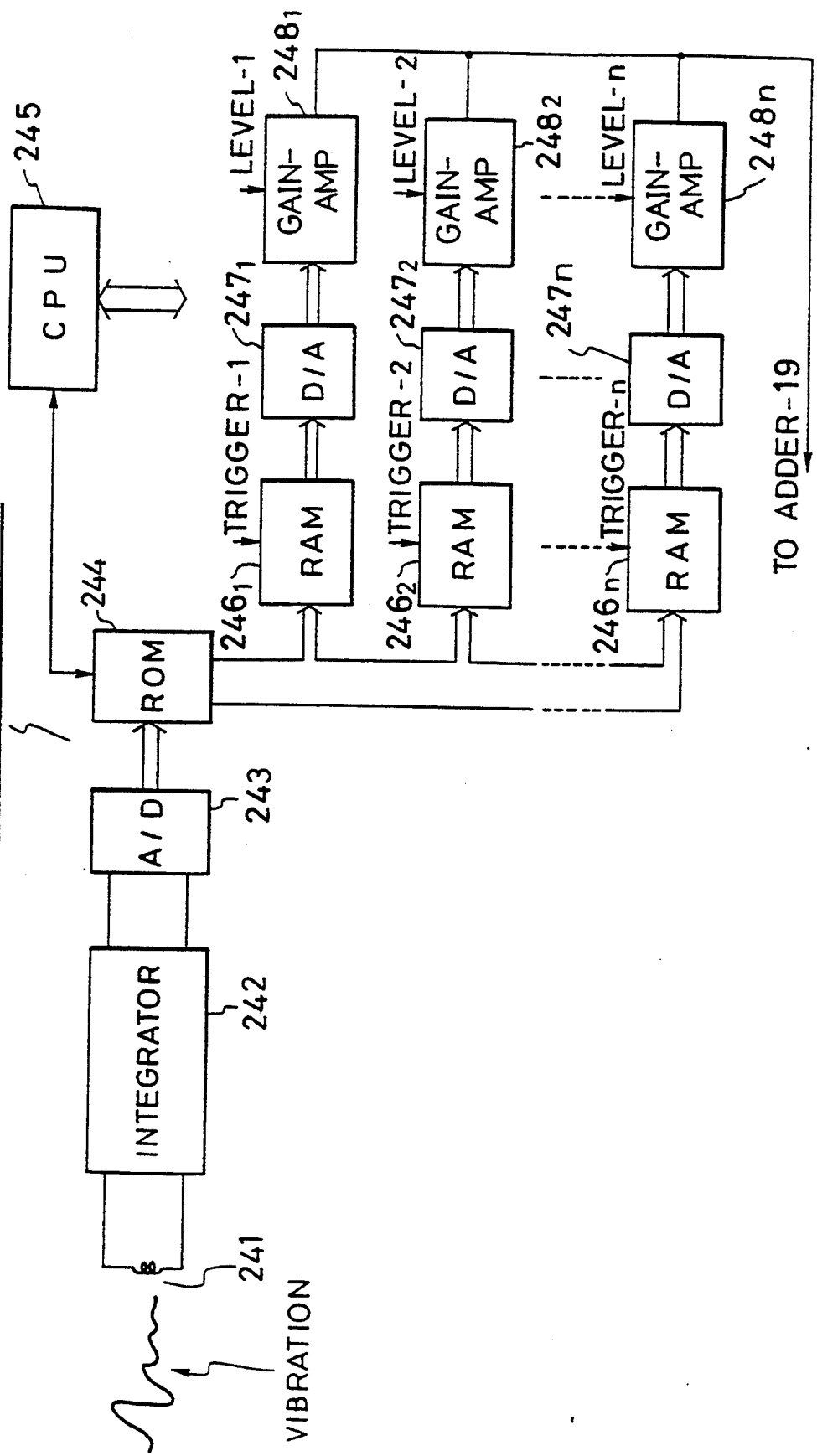

FIG.33A — GRADIENT FIELD WAVEFORM
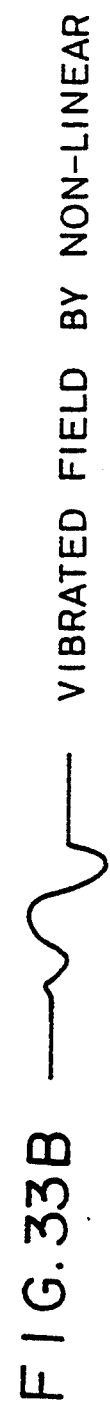
FIG.33B — VIBRATED FIELD BY NON-LINEAR
FIG.34A — GRADIENT FIELD WAVEFORM
FIG.34B — VIBRATION CORRECTING FIELD (INSUFFICIENT CORRECTION)

MAGNETIC RESONANCE IMAGING METHOD AND APPARATUS CAPABLE OF COMPENSATING FOR DISTURBED GRADIENT FIELD CAUSED BY EDDY CURRENT

BACKGROUND OF THE INVENTION

1. Field of the Invention

The present invention generally relates to a magnetic resonance (MR) imaging method and an MR imaging system. More specifically, the present invention is directed to such MR imaging method/system capable of compensating for a disturbed gradient field caused by an eddy current field.

2. Description of the Prior Art

A magnetic resonance (MR) imaging system has been widely utilized in the medical electronic field. In an MR imaging system, a static field is produced from a main magnet wound on an air-core. A biological body under medical examination such as patient is laid within this air-core of the main magnet under influence of the static field. When an RF pulse is applied to this patient under the above-described condition, an MR signal is induced therein. Normally, to acquire positional information of the MR signal, three-orthogonal gradient fields are applied to the patient, the strengths of which are gradually changed along the three orthogonal axes. The three-orthogonal gradient fields are produced by the gradient coils driven by the gradient field power source.

When the drive currents are supplied from the gradient field power source to produce the gradient fields, an eddy current happens to occur in an electrically conductive member which constitutes the main magnet. Accordingly, the three-orthogonal gradient fields are disturbed, or deformed from the desirable gradient fields due to the eddy current. In this case, the image quality of the MR image is deteriorated.

To avoid such an image deterioration, the following conventional eddy current compensating methods have been proposed. That is, the active gradient coil system has been employed as the gradient field coil system, in which the gradient fields are generated only in the MR imaging region and also give no influence to the main magnet field. Alternatively, the eddy current compensating currents are superimposed with the drive current to the gradient coils.

However, the conventional active gradient coil system has a practical drawback in use that very high precision is required in manufacturing the complex coil construction, and total cost of this gradient coil system becomes very expensive.

In case of the eddy current compensating method, if both of the gradient field coil and the portion of the main magnet where the eddy current is produced are completely fixed and also no such an LRC circuit magnetically coupled to the gradient field within the main magnet is present, disturbance in the gradient field caused by the eddy current may be avoided. However, such an LRC circuit is actually present within the main magnet, and/or the portion of the main magnet where the eddy current is induced is mechanically vibrated. As a result, a magnetic field having a damped vibrating waveform is produced, which may disturb the gradient fields. Therefore, the image quality of the MR image is deteriorated. Furthermore, if the objects for generating the eddy current fields are arranged in an asymmetrical form with respect to the gradient field coils, even-numbered components of the eddy current fields may cause the following problems. These objects are made of, for instance, a metal cylinder for a thermal-shielding purpose in the main magnet. For example, as described in Japanese KOKAI (Disclosure) Patent Application No. 63-82638 (1988), when the metal cylinders are positioned in an asymmetrical shape with respect to the gradient field coils, the even-numbered components of the eddy current fields are produced along the vertical direction, which may disturb the gradient fields. To connect such a disturbance of the gradient fields, the correction coil is employed.

Also, as described in Japanese Patent Application No. 2-144040 (1990), the entire gradient field coil system is subdivided into two coil systems, and the correction gains of these subdivided coil systems are independently determined. However, since the gradient field coil system should be subdivided into two coil systems, two sets of large-scaled constant current sources for producing the major magnetic fields are required, resulting in higher installation cost. Furthermore, there is another problem that the eddy current fields with different numbers along the vertical direction cannot be corrected.

SUMMARY OF THE INVENTION

The present invention has been made in an attempt to solve the above-described conventional problems, and therefore, has an object to provide a magnetic resonance imaging method and a magnetic resonance imaging system capable of compensating for a disturbed gradient field caused by the eddy current field (i.e., mechanical vibration) to obtain a desirable gradient field.

Another object of the present invention is to provide an MR imaging system with a simple gradient field generating unit capable of compensating for an asymmetrically disturbed gradient field caused by the asymmetrical arrangement of the eddy current fields.

These objects and other features of the present invention can be achieved by providing:

a method for imaging a biological body (50) under medical examination by utilizing a magnetic resonance (MR) phenomenon under influence of a static magnetic field and a gradient magnetic field to acquire an MR image of a preselected slice portions within the biological body (50), comprising the steps of:

producing (3) a first drive current on which an eddy current field compensating current has been superimposed;

producing (100:200) a vibrating-field compensating current for compensating a gradient field vibrated by the eddy current; and superimposing (100:200) the vibrating-field compensating current on the first drive current to obtain a second drive current, said second drive current being supplied to gradient coil means (7) for generating a gradient field whose vibrating field component has been compensated.

According to another aspect of the present invention, a method for imaging a biological body (50) under medical examination by utilizing a magnetic resonance (MR) phenomenon under influence of a static magnetic field and a gradient magnetic field to acquire an MR image of a preselected slice portion within the biological body (50), comprises the steps of:

producing (3) a first drive current on which an eddy current field compensating current has been superimposed;

producing (100:200) the asymmetrically vibrating-field compensating current for compensating asymmetric gradient fields vibrated by the eddy current; and superimposing (100:200) the asymmetrically vibrating-field compensating current on the first drive current to obtain a second drive current, said second drive current being supplied to at least one coil segment (A1:A2:B1:B2) of a gradient coil assembly (7X:7Y:7Z) for generating a gradient field whose asymmetrically vibrating field components have been compensated.

Also, according to a further aspect of the present invention, a magnetic resonance (MR) imaging system (1000:2000) wherein a biological body (50) under medical examination is imaged by utilizing an MR phenomenon under influence of a static magnetic field and a gradient magnetic field to acquire an MR image of a preselected slice portion within the biological body (50), comprises:

gradient coil means (7) for generating the gradient magnetic field;

source manes (3) for producing a first drive current on which an eddy current field compensating current has been superimposed;

producing means (18:210) for producing a vibrating-field compensating current for compensating a gradienit field vibrated by the eddy current; and superimposing (100:200) the asymmetrically vibrating-field compensating current on the first drive current to obtain a second drive current, said second drive current being supplied to at least one coil segment (A1:A2:B1:B2) of a gradient coil assembly (7X:7Y:7Z) for generating a gradient field whose asymmetrically vibrating field components have been compensated.

Furthermore, according to a still further aspect of the present invention, a magnetic resonance (MR) imaging system (1000) wherein a biological body (50) under medical examination is imaged by utilizing an MR phenomenon under influence of a static magnetic field and a gradient magnetic field to acquire an MR image of a preselected slice portion within the biological body (50), comprises:

gradient coil means (7) for generating the gradient magnetic field;

source means (3) for producing a first drive current on which an eddy current field compensating current has been superimposed;

producing means (30) for producing an asymmetrically vibrating-field compensating current for compensating asymmetric gradient fields vibrated by the eddy current: and superimposing means (100) for superimposing the asymmetrically vibrating-field compensating current on the first drive current to obtain a second drive current, said second drive current being supplied to at least one coil segment (A:A2:B1:B2) of a gradient coil assembly (7X:7Y:7Z) for generating a gradient field whose asymmetrically vibrating field components have been compensated.

BRIEF DESCRIPTION OF THE DRAWINGS

For a better understanding of the present invention, reference is made of the following detailed descriptions in conjunction with the accompanying drawings, in which:

FIG. 8 is a circuit diagram of a second mechanical vibration compensation unit employed in the analog type compensating unit 100;

FIGS. 30A to 30C show waveforms of operation by the first digital field vibration compensating unit 220;

FIG. 31 is a schematic block diagram for showing a second digital type field vibration compensating unit 240;

FIGS. 32A through 34B represent waveforms for explaining other vibration correcting methods according to the third preferred embodiment.

DETAILED DESCRIPTION OF THE PREFERRED EMBODIMENTS

Basic Ideas

Before describing various preferred embodiments, basic ideas of the present invention will now be summarized.

In accordance with a first basic idea of the present invention, a drive current on which an eddy current compensating current has been superimposed is supplied to a gradient field coil for applying a gradient field to a biological body under medical examination laid in a static magnetic field. Furthermore, a vibrating-field compensating current is superimposed on this drive current, which is finally and actually supplied to the gradient coil. Since such a drive current synthesized with not only the eddy current compensating current but also the vibrating-field compensating current is furnished to the grainiest coil, disturbance in the gradient field caused by the vibrating field (produced due to the mechanical vibration of the main coil component) can be sufficiently compensated.

A second basic idea of the present invention is achieved as follows: In such an MR imaging system equipped with a gradient field power source unit capable of supplying a drive current to a gradient field coil for applying a gradient field to a biological body medical examination laid in a static magnetic field, this gradient field power source unit comprises a means for superimposing a current to change a condition of an eddy current field on the drive current. This condition changing current is, for instance, a current for compensating an asymmetry of the eddy current field induced in the main magnet component. Such a drive current synthesized with the compensating current is supplied to a specific coil segment selected from the entire gradient coil assembly.

Overall Arrangement of Analog Compensating Type MR Imaging System

Figure 1:
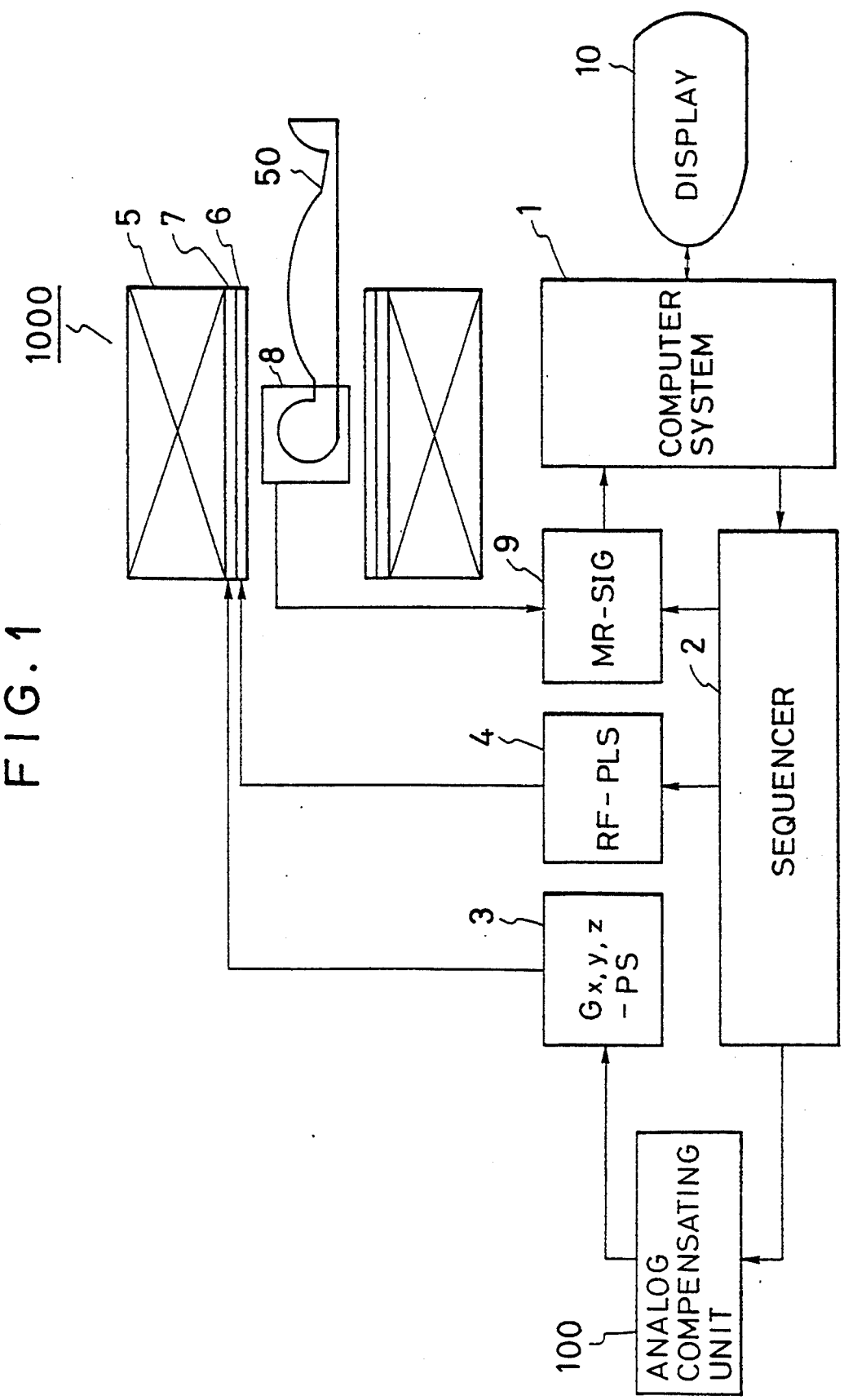
FIG. 1 is a schematic block diagram for showing an overall arrangement of a magnetic resonance imaging system 1000 equipped with an analog type compensation unit 100, accomplished by a first basic idea, according to a first preferred embodiment of the present invention.

Referring now to FIG. 1, a description will be made of an MR imaging system 1000 including an analog type compensating unit 100, according to a first preferred embodiment of the present invention. This analog compensating type MR imaging system 1000 is realized based upon the above-described first basic idea, and also the second basic idea.

The first analog compensating type MR imaging system 1000 is mainly constructed of a computer system 1. Under control of this computer system 1, a gradient field power source unit (Gx,y,z-PS) 3 and a transmitter unit (RF-PLS) 4 are operated in response to a pulse sequence produced from a sequencer 2. As a result, an RF (radio frequency) pulse is applied from an RF coil 6 to a biological body under medical examination such as a patient 50. The patient 50 is laid in a static magnetic field produced by a main magnet 5 within an air core thereof. In addition, a gradient field is supplied from a gradient field coil (assembly) 7 to the patient 50. As a result, an MR (magnetic resonance) signal such as a spin-echo signal is induced in a preselected slice portion of the patient 50. This MR signal is received via a signal receiving probe 8 to an MR signal receiver 9. The received MR signal is detected in this receiver 9 and thereafter processed in the computer system 1. In the computer system 1, an MR image is reconstructed from the acquired MR signals and then, the reconstructed MR image is displayed on a monitor 10.

Precisely speaking, in accordance with the major feature of the first MR imaging system 1000, an analog type compensating unit 100 is interposed between the sequencer 2 and the gradient field power source unit 3. As a consequence, a vibrating-field compensating circuit can be superimposed on the drive current synthesized with the eddy current compensating current.

Figure 2:
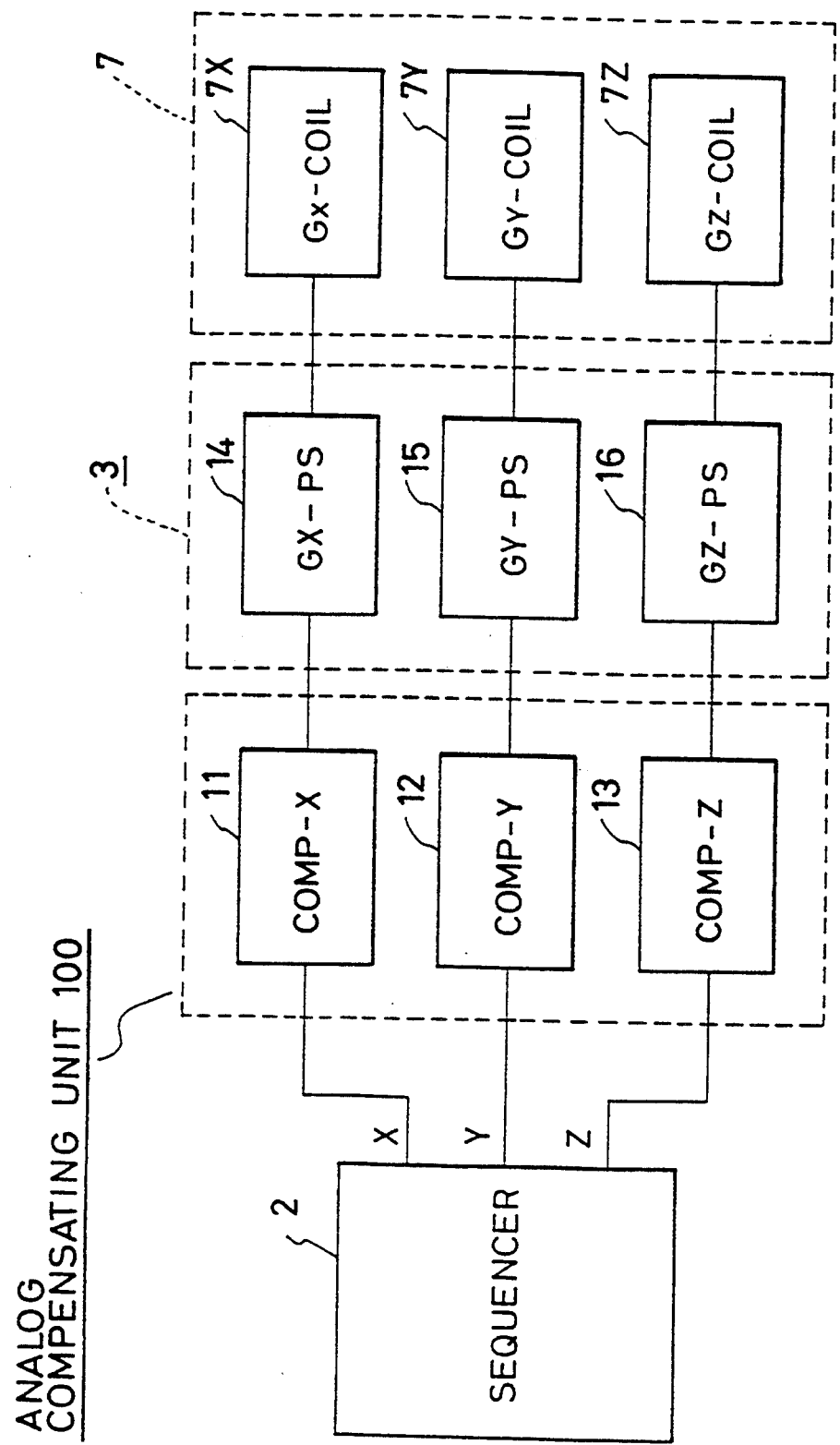
FIG. 2 is a schematic block diagram for representing a detailed circuit arrangement of the analog type compensating unit 100 interposed between the sequencer 2 and the gradient field power sources 14–16, employed in the first MR imaging system 100 of FIG. 1.

FIG. 2 represents a detailed circuit arrangement from the sequencer 2 via the analog type compensating circuit 100 to the gradient field power source unit 3 and the gradient coil assembly 7. As apparent from FIG. 2, a gradient coil 7X of the gradient coil assembly 7 is connected to the sequencer 2 via an X-gradient field power source (Gx-PS) 14 of the gradient coil assembly 3 and an X-compensating circuit (COMP-X) 11 of the analog type compensating circuit 100. Similarly, the remaining gradient coils 7Y and 7Z are separately connected to the sequencer 2. These three gradient coils 7X, 7Y, and 7Z are positioned along three orthogonal directions X, Y and Z (see FIG. 11).

Figure 3:
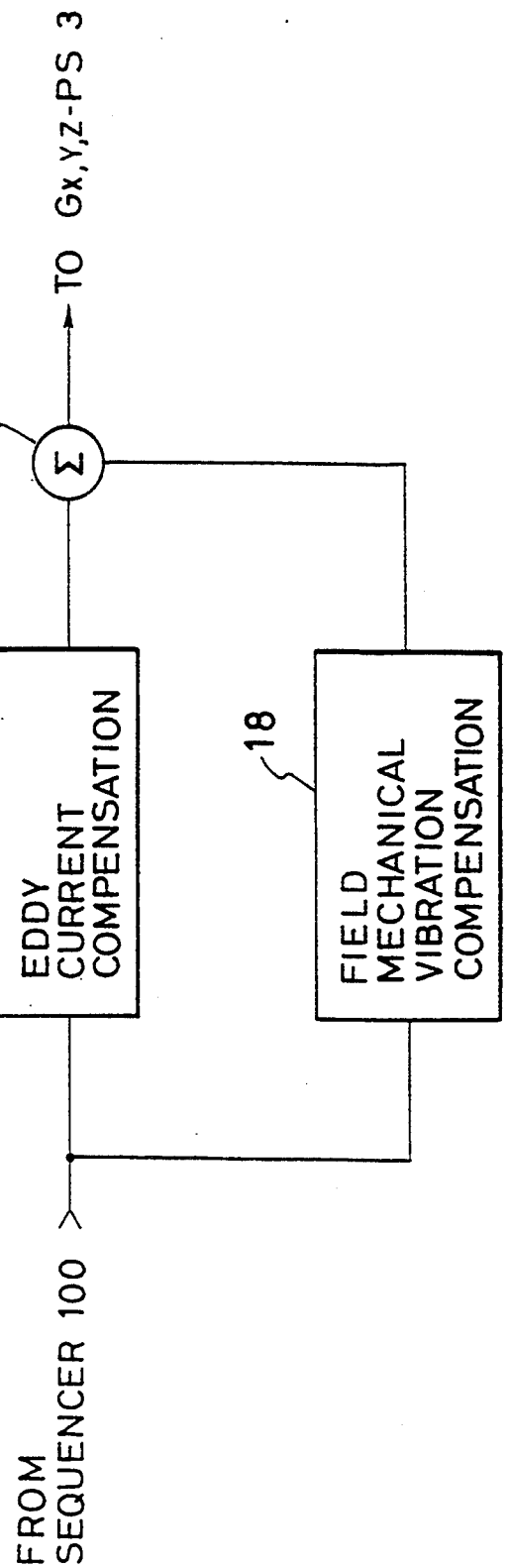
FIG. 3 is a schematic block diagram for indicating an internal circuit arrangement of an X-compensating circuit 11 constituting the analog type compensating unit 100 of FIG. 1.

Also, FIG. 3 shows a circuit arrangement of the above-described X-compensating unit 11 indicated in FIG. 2. This X-compensating unit 11 is constructed of an eddy current compensating circuit 17, a field vibration compensating circuit 18 connected parallel to the eddy current compensating circuit 17, and an adder circuit 19. Thus, the eddy current compensating current derived from the eddy current compensating circuit 17 and the vibrating-field compensating current derived from the field vibration compensating current 18 are added in the adder 19 to obtain a synthesized drive current for the X-gradient coil 7X. This synthesized drive current is supplied to drive the X-gradient coil 7X. Since the synthesized drive current is made that the eddy current compensating current is superimposed on the drive current having the desirable waveform set in the sequencer 2, and simultaneously superimposed with the vibrating-field compensating current, disturbance contained in the X-gradient field, which is caused by the vibrating-field waveform, can be corrected, or compensated.

It should be noted that since the remaining Y-compensating circuit 12 and Z-compensating circuit 13 are constructed of the similar circuit arrangement shown in FIG. 3, no further explanation thereof is made in the following description.

Practical Circuit Of Eddy Current Compensating Circuit 17

Figure 4:
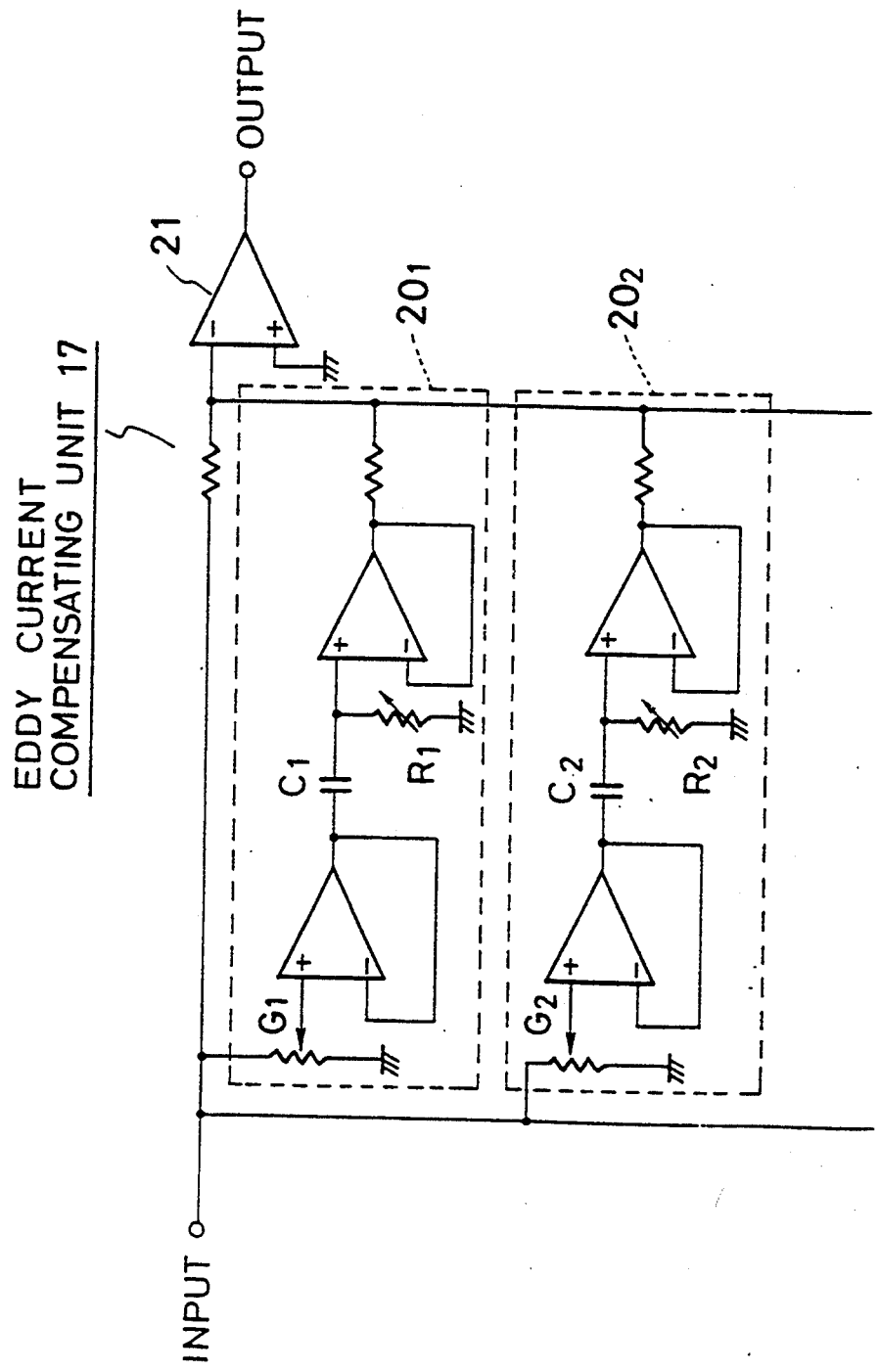
FIG. 4 shows an internal circuit diagram of the eddy current compensating unit 17 shown in FIG. 3.
Figure 5:
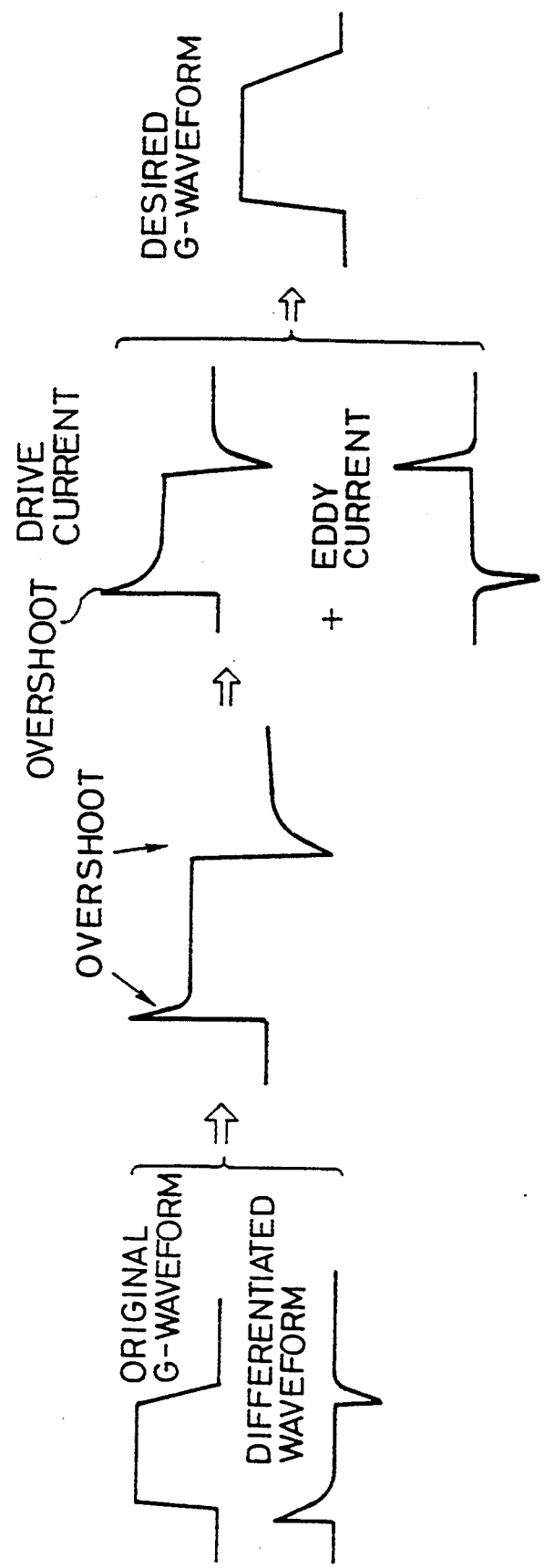
FIGS. 5A to 5D pictorially explain a basic idea for producing waveforms of the gradient field compensated by the analog type compensating unit 100 of FIG. 1.

In FIG. 4, there is shown a practical circuit of the above-described eddy current compensating circuit 17 of FIG. 3. The eddy current compensating circuit 17 is constructed of a combination arrangement between a differentiating circuit $20_1(20_2, \ldots, 20_n)$ and an adder 21. A total number of this differentiating circuit 20 is selected, taking account of the time constant owned by the eddy current induced in the main magnet 1 (see FIG. 1). In the respective differentiating circuits $20_1$, $20_2, \ldots, 20_n$, the gain of the differentiated waveform shown in FIG. 5A is controlled by varying a variable resistor $G_1$, $G_2$, whereas the time constant is controlled by changing another variable resistor $R_1$, $R_2$. As a consequence, it can be so adjusted that the gradient field waveform becomes the original gradient field waveform having no eddy current disturbance.

That is to say, as shown in FIG. 5A, an original gradient-field waveform suitable for the gradient field waveform is synthesized with a differentiated original gradient-field waveform. Then, a waveform having an overshoot is produced as indicated in FIG. 5B. Thereafter, this waveform having the overshoot as a drive current waveform is added to an eddy current waveform as represented in FIG. 5C. Accordingly, a desirable gradient field waveform shown in FIG. 5D can be produced from the gradient field coil 7, by which the eddy current waveform (not shown) induced in the conventional gradient field can be canceled.

First Practical Circuit of Field-Vibration Compensating Unit 18

Figure 6:
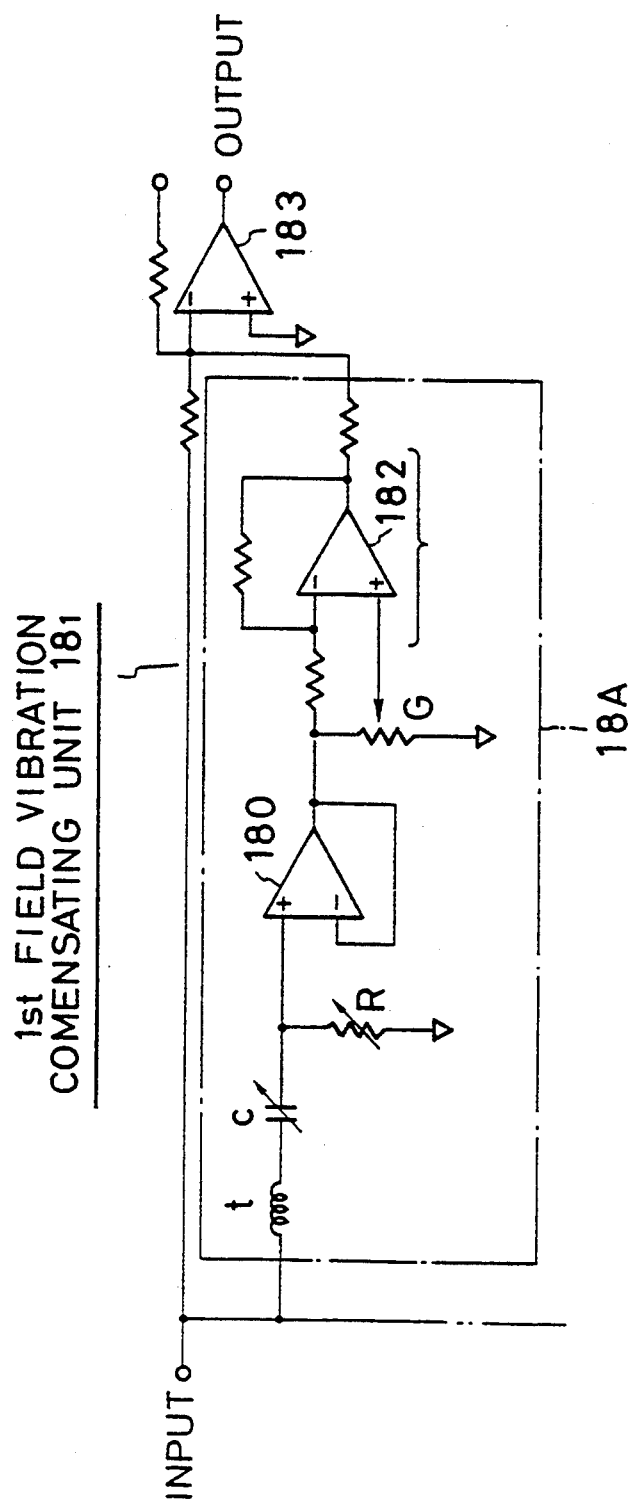

FIG. 6 shows a first practical circuit $18_1$ of the field-vibration compensating circuit 18 indicated in FIG. 3. The first practical field-vibration compensating circuit $18_1$ is mainly arranged by an RLC circuit with operational amplifiers 180, 181 and 182. The first practical field-vibration compensating circuit $18_1$ produces a damped vibrating waveform triggered by the original waveform in such a manner that an amplitude and a period of the damped vibrating waveform correspond to those of the original waveform. A total number of the circuit arrangement 18A is determined, taking account of a period and a time constant of the damped vibration, although only one circuit arrangement 18A is shown in FIG. 6. The gain of this circuit arrangement 18A is variable from a positive (+) value to a negative (−) value by the second operational amplifier 182. It should be noted that a time constant "Tc" and a variation frequency "fv" are defined as follows:

$$Tc = 2 L/R$$

$$fv = \{(1-Lc)-(R^2/2L^2)\}^{\frac{1}{2}}$$

Figure 7:
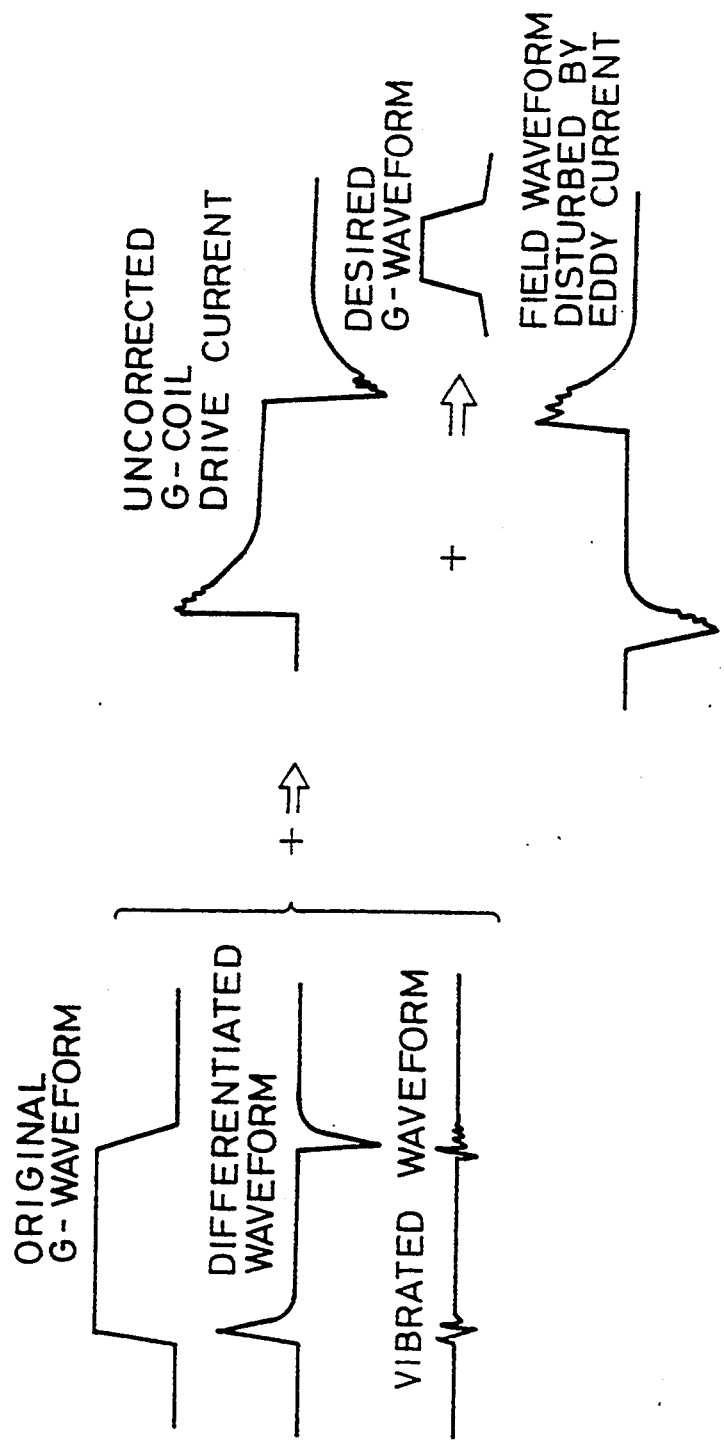
FIG. 7 schematically illustrates waveform transition when the vibrating waveform is compensated for by the analog type compensating unit 100 of FIG. 1.

Subsequently, such a vibrating-field compensating output signal from the first field-vibration compensating unit $18_1$ shown in FIG. 6 is superimposed on the above-described eddy current compensating output signal from the eddy current compensating unit 17 (see FIG. 4) as illustrated in FIG. 7. Accordingly, the overshoot current waveform containing the vibrating-field waveform is produced and supplied to the gradient coil 7 via the gradient field power spruce units 14 to 16 (see FIG. 4). As a result, both of the eddy current waveform and the vibrating field waveform are canceled, so that a desired gradient field waveform corresponding to the original gradient field waveform can be produced from the gradient coil 7.

Second Field Vibration Compensating Unit $18_2$

Figure 8:
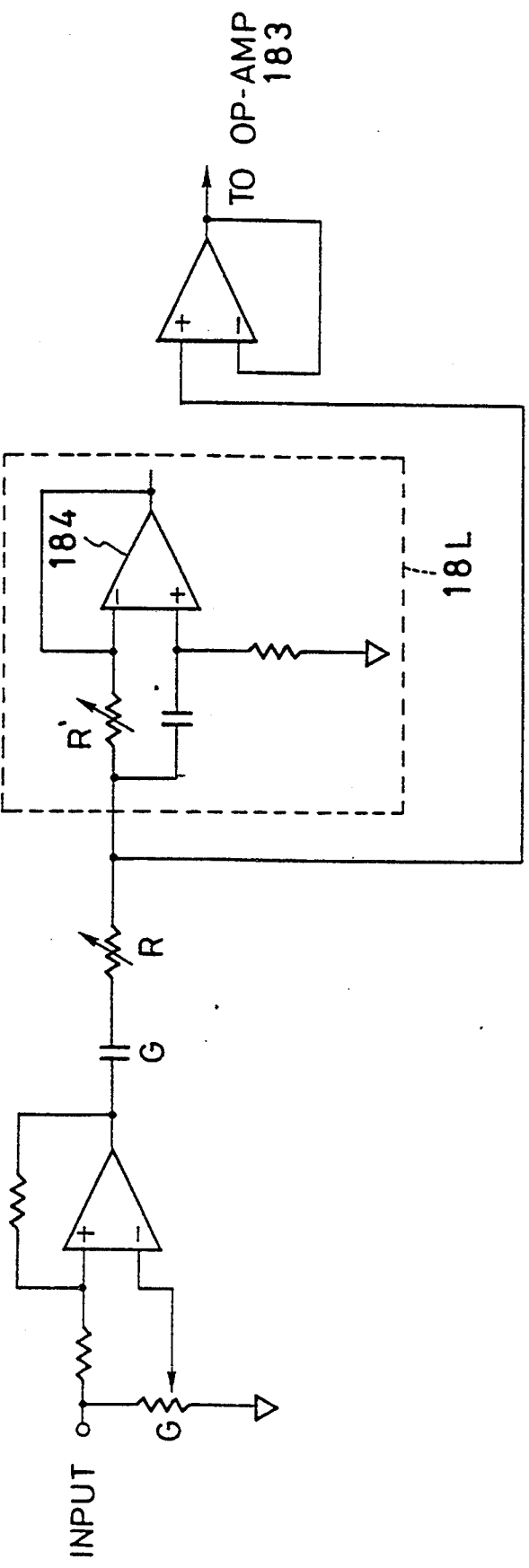
FIG. 8 is an internal circuit arrangement of a first mechanical vibration compensating unit employed in the analog type compensating unit 100.

FIG. 8 shows a practical circuit diagram of a second field vibration compensating unit $18_2$ belonging to the first preferred embodiment of the invention.

This second field vibration compensating unit $18_2$ owns such a capability to compensate a vibrating-field waveform when the inductance (L) is greater than several henries (H), depending upon the time constant of the damped vibration. The second field vibration compensating unit $18_2$ corresponds to the circuit portion 18A of FIG. 6. A circuit portion 18L including an operational amplifier 184 functions as an inductance (L).

It should be noted that instead of the second field vibration compensating unit $18_2$, an NIC (negative immittance converter) circuit may be alternatively employed.

Third Field Vibration Compensating Unit $18_3$

Figure 9:
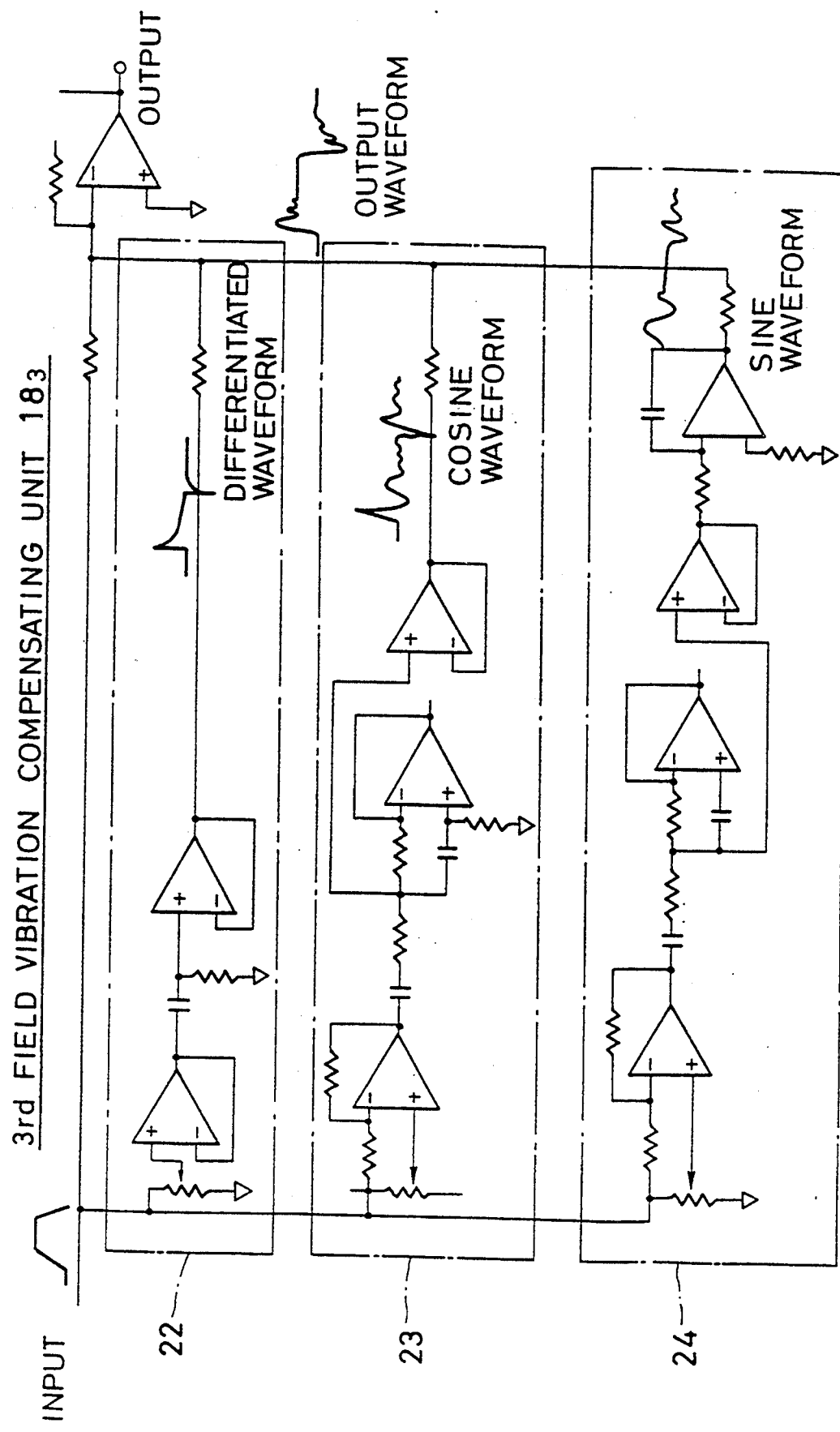
FIG. 9 is a circuit diagram of a third mechanical vibration compensation unit employed in the analog type compensating unit 100.

FIG. 9 represents a practical circuit diagram of a third field vibration compensating unit $18_3$ belonging to the first preferred embodiment. This third field vibration compensating unit $18_3$ can have a function to produce a sine waveform in synchronism with the gradient field waveform in addition to a cosine waveform in synchronism with the gradient field waveform.

The third field vibration compensating unit $18_3$ is mainly constructed of a differentiating circuit 22, a cosine vibration circuit 23, and a sine vibration circuit 24, which are parallel-connected to each other. The waveforms produced from these differentiating circuit 22, cosine vibration circuit 23, and sine vibration circuit 24 are represented in FIG. 9. A total number of the parallel circuit arrangement is determined, taking account of compensation capability for the gradient field waveform.

Arrangement of First Asymmetric Field Compensating Unit $30_l$

Figure 10:
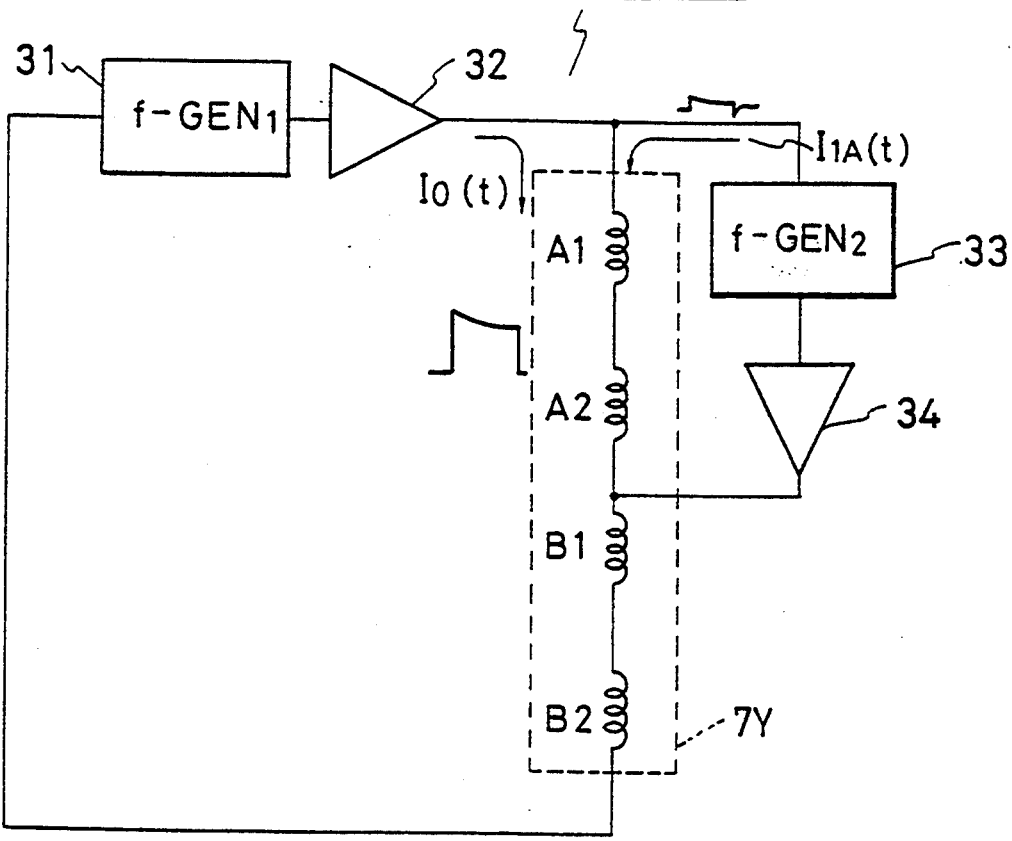
FIG. 10 is a circuit diagram of a first asymmetric field compensating unit $30_1$ accomplished by a second basic idea of the invention.
Figure 11:
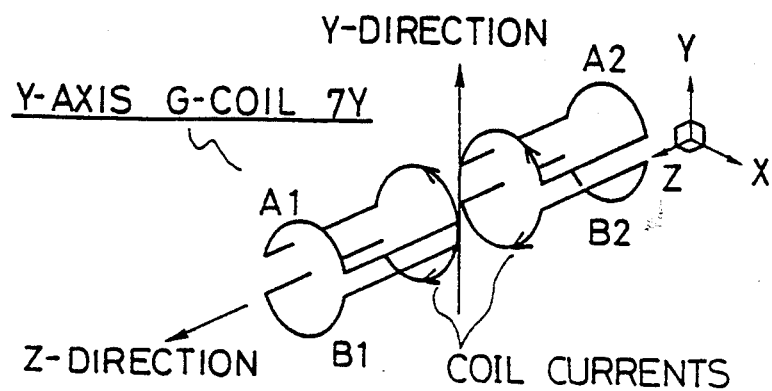
FIG. 11 illustrates a Y-axis gradient coil system.

Referring now to FIGS. 10 and 11, a first asymmetric field compensating unit $30_1$ for compensating an asymmetric condition of an eddy current field, accomplished by the second basic idea of the present invention, will now be explained in accordance with a second preferred embodiment.

It should be noted that for the sake of simple explanation, only an Y-axis gradient field generating system equipped with the asymmetric field compensating unit will be described in detail, and this second basic idea may be similarly applied to the remaining X-axis and Z-axis gradient field generating systems.

In the first asymmetric field compensating unit $30_1$ used in the Y-axis gradient field generating system, a major arbitrary function generator 31 for correcting an eddy current, and a major constant current source 32 for producing a major magnetic field are series-connected to a Y-axis gradient field coil assembly 7Y. Thus, the drive current on which the eddy current compensating current has been superimposed is supplied to the Y-axis gradient field coil 7Y so as to compensate the eddy current field. However, as previously described, the asymmetric problem of the eddy current is not yet solved by employing only the major arbitrary function generator 31 and the major constant current source 32. To this end, according to the second basic idea, another (auxiliary) arbitrary function generator 33 for correcting an asymmetric field and a constant current source 34 are series-connected to each other, and this series circuit arrangement 33, 34 is connected parallel to a Y-axis coil segment, namely, a winding A1 and a winding A2.

As illustrated in FIG. 11, the Y-axis gradient field coil assembly 7Y is constructed of 4 coil segments, e.g., saddle coils A1, A2, B1 and B2 spatially arranged along the Y direction.

Figure 12:
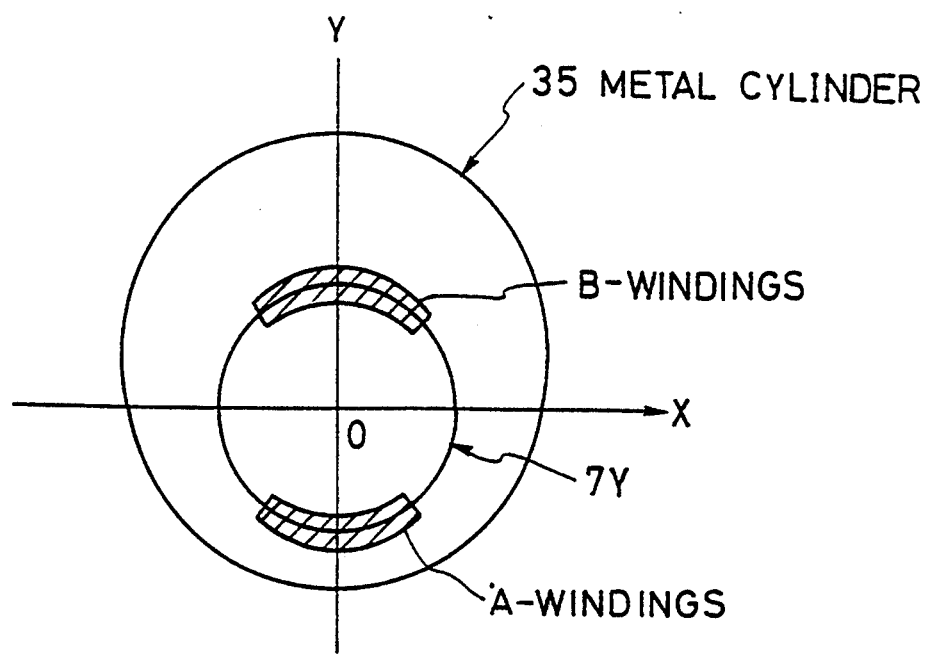
FIGS. 12 to 14 are illustrations for explaining the asymmetric field to be corrected by the asymmetric field compensating unit.
Figure 13:
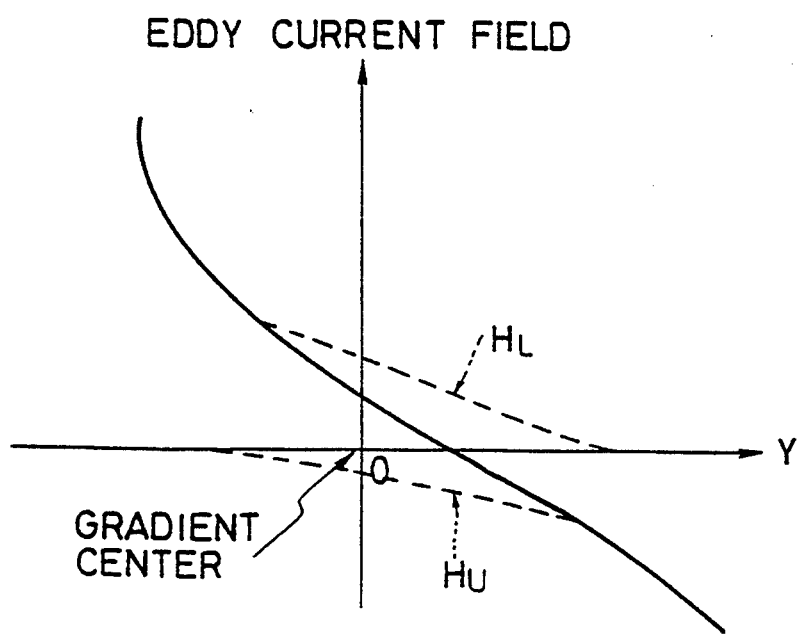
Figure 14:
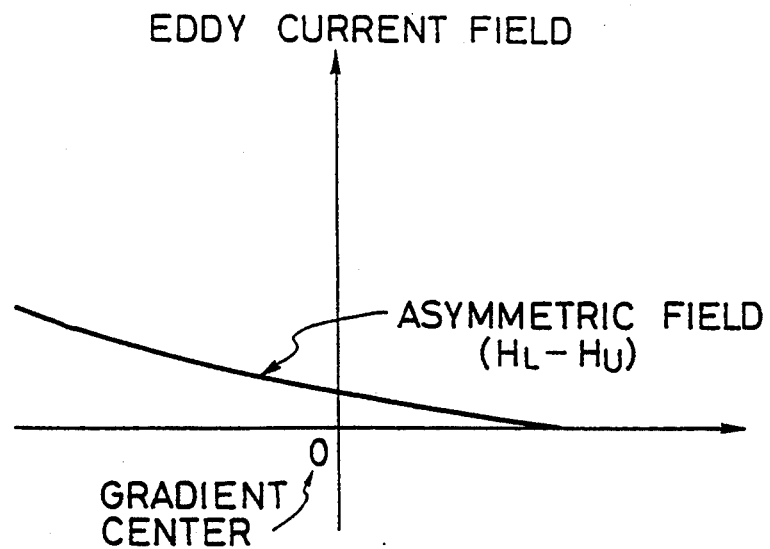

Now, such a spatial asymmetric condition of an eddy current field will be summarized with reference to FIGS. 12 to 14.

Assuming now that a metal cylinder 35 is arranged outside the Y-axis gradient coil 7Y, a center of the Y-axis gradient field is not coincident with a center of the eddy current field as described in the above-mentioned Japanese KOKAI Patent Application No. 63-82638 (as indicated by solid lines of FIG. 12(, As a consequence, the spatial asymmetric condition of the eddy current field is produced with respect to the field center of the Y-axis gradient coil 7Y.

A solid line shown in FIG. 13 is formed by superimposing an eddy current field "$H_y$" from a lower side of the Y-axis with an eddy current field "$H_u$" from an upper side of the Y-axis. In this example, since the eddy current field at the metal cylinder 35 is eccentrically positioned with respect to the Y-axis gradient coil 7Y, the eddy current field form the lower side gives stronger influences than that of the upper side, and therefore the center of the eddy current field is positionally shifted toward the upper side.

On the other hand, the above-described asymmetric characteristic in the upper and lower eddy current fields "$H_u$" and $H_x$" may be defined by a difference therebetween as shown in FIG. 14. In other words, such an asymmetric eddy current field may be caused by eccentrically positioning the metal cylinder 35 of FIG. 12.

To correct such an asymmetric field characteristic, the eddy current field is coincident with the upper eddy current field "$H_u$" of FIG. 13 by combining the major arbitrary function generator 31 for correcting the eddy current with the major constant current source 32, so that the difference between the lower eddy current field "$H_x$" and the upper eddy current field "$H_u$" may clearly define the asymmetric field component.

Subsequently, a compensation current capable of compensating this asymmetric field component is supplied to a preselected Y-axis gradient field coil segment A1, A2, B1, B2 by employing a combination between the arbitrary function generator 33 for correcting the asymmetric field component and the auxiliary constant current source 34 for correcting the asymmetric field component. As a sequence, the above-defined asymmetric field component can be canceled, or compensated. In this case, referring back to the first asymmetric field compensating unit $30_1$, a current $I_{1A}(t)$ is additionally supplied to the coil windings A1 and A2 in conjunction with another current $I_o(t)$. Namely, the first current $K_{1A}(t)$ is positively added to the second current $I_o(t)$.

Second Asymmetric Field Compensating Unit $30_2$

Figure 15:
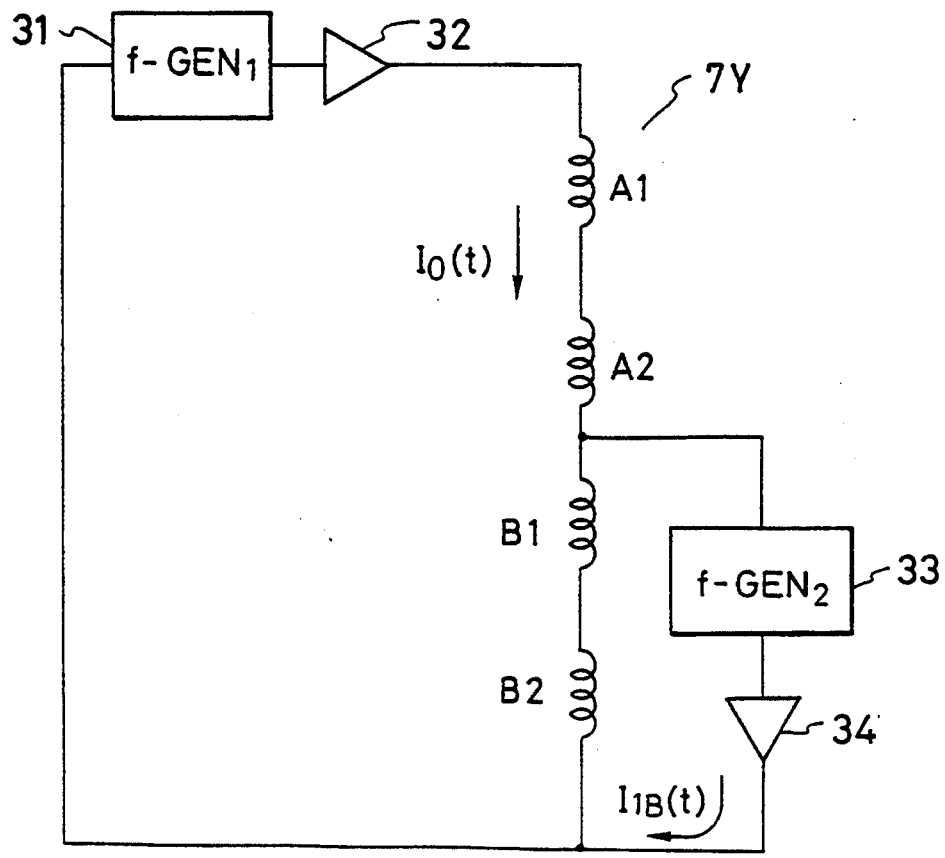
FIG. 15 is a circuit diagram of a second asymmetric field compensating unit $30_2$.

To the contrary, according to the second basic idea of the invention, another asymmetric field compensating method can be realized. That is, the eddy current field is coincident with the lower eddy current field "$H_L$" as shown in FIG. 13 by employing the combination circuit of the major arbitrary function generator 31 and the major constant current source 32. Then, a compensation current capable of compensating the asymmetric field component is supplied to the Y-axis gradient coil B-segment, i.e., the coil windings B1 and B2 by a second Y-axis asymmetric field compensating unit $30_2$ belonging to the second preferred embodiment of the invention. In this case, an asymmetric-field compensating current $I_{1B}(t)$ is supplied to the gradient coil windings B1 and B2 along a direction to reduce the eddy-current compensating current $I_o(t)$, as shown in FIG. 15.

Figure 16:
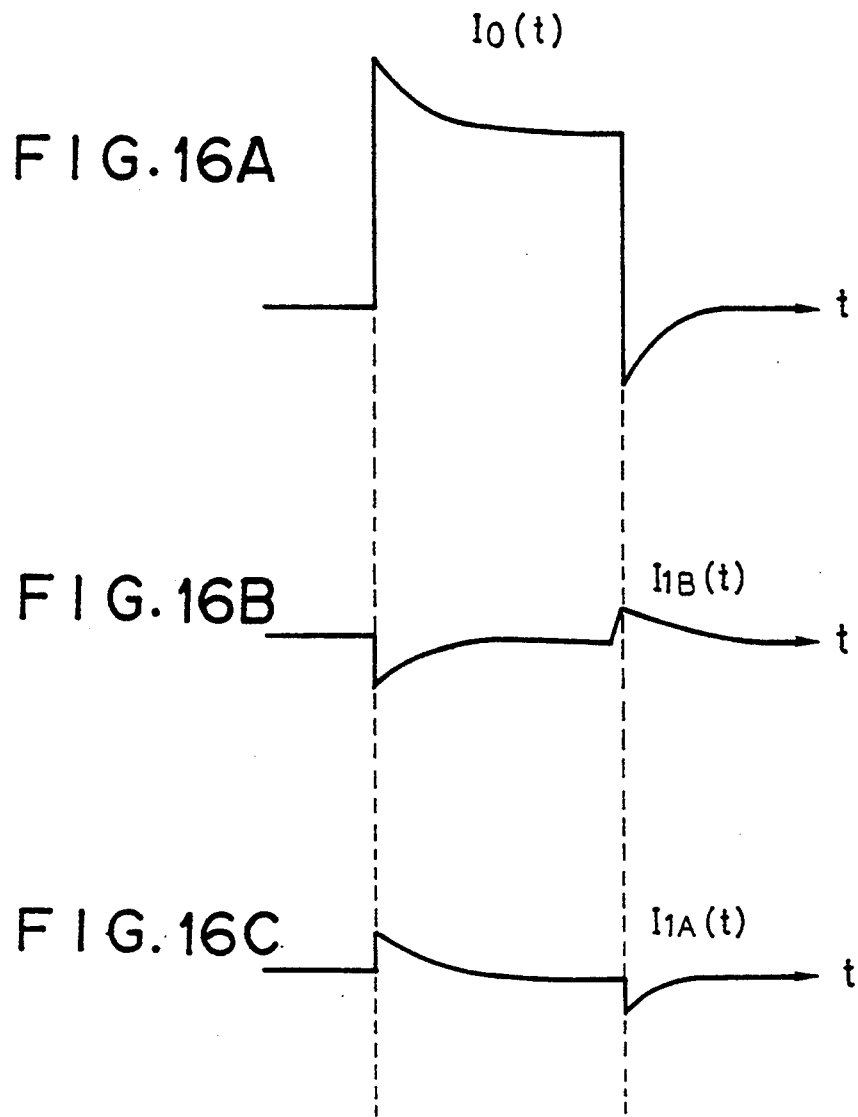
FIG. 16A, 16B and 16C show a waveform chart of the vibrating-field compensating currents flowing through the first and second asymmetric field compensating units $30_1$ and $30_2$.

A relationship among these coil currents $I_o(t)$, $I_{1A}(t)$ and $I_{1B}(t)$ is illustrated in FIGS. 16A to 16C.

FIG. 16A represents the eddy-current compensating current $I_o(t)$ derived from the major arbitrary function generator 31 for correcting the eddy current and the major constant current source 32. FIG. 16B indicates the asymmetric field compensating current $I_{1B}(t)$ to be supplied to the B-coil segments B1 and B2, which is derived from the arbitrary function generator 33 and the axillary constant current source 34 of FIG. 15. FIG. 16C shows the asymmetric field compensating current $I_{1A}(t)$ to be supplied to the A-coil segments A1 and A2, which is produced from the arbitrary function generator 33 and the arbitrary constant current source 34 of FIG. 10.

Third to Fifth Asymmetric Field Compensating Units $30_3$ to $30_5$

Figure 17:
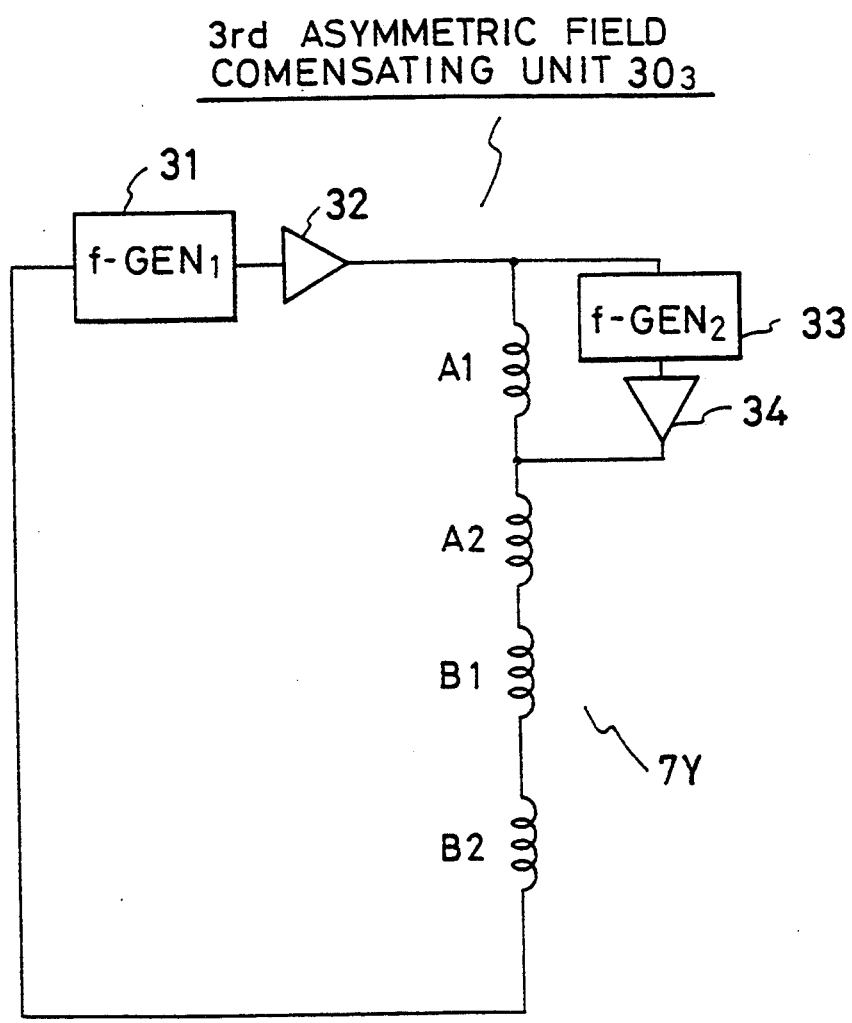
FIG. 17 is a circuit diagram of a third asymmetric field compensating unit $30_3$.
Figure 18:
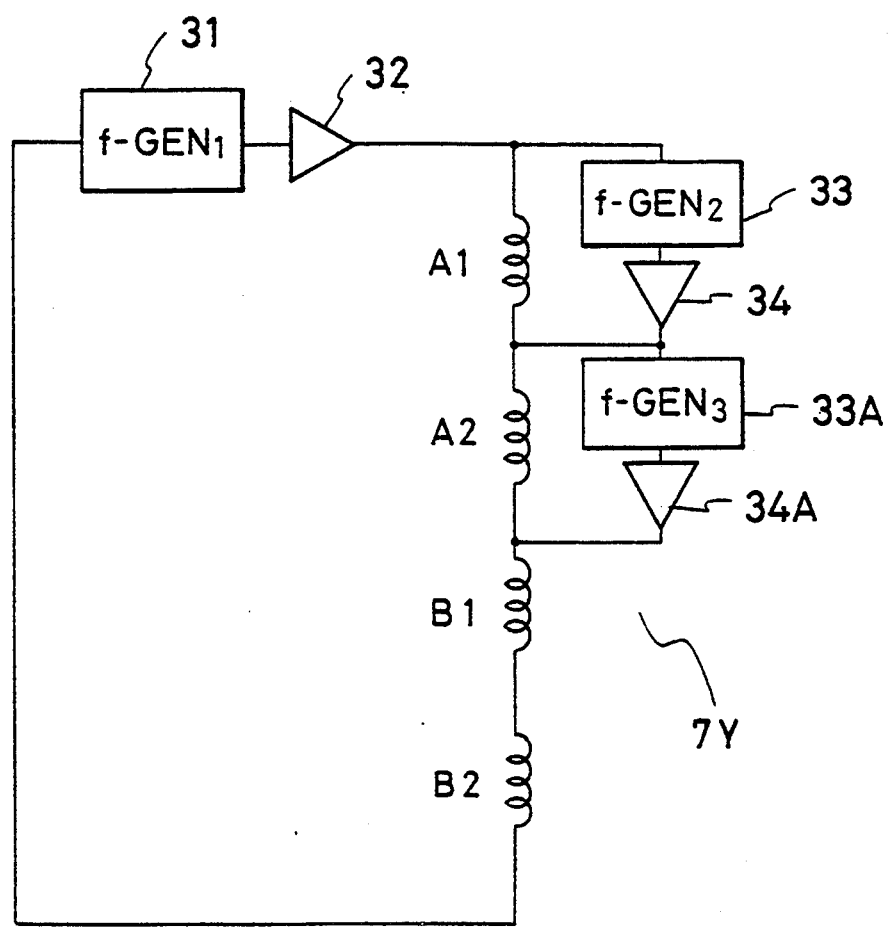
FIG. 18 is a circuit diagram of a fourth asymmetric field compensating unit $30_4$.
Figure 19:
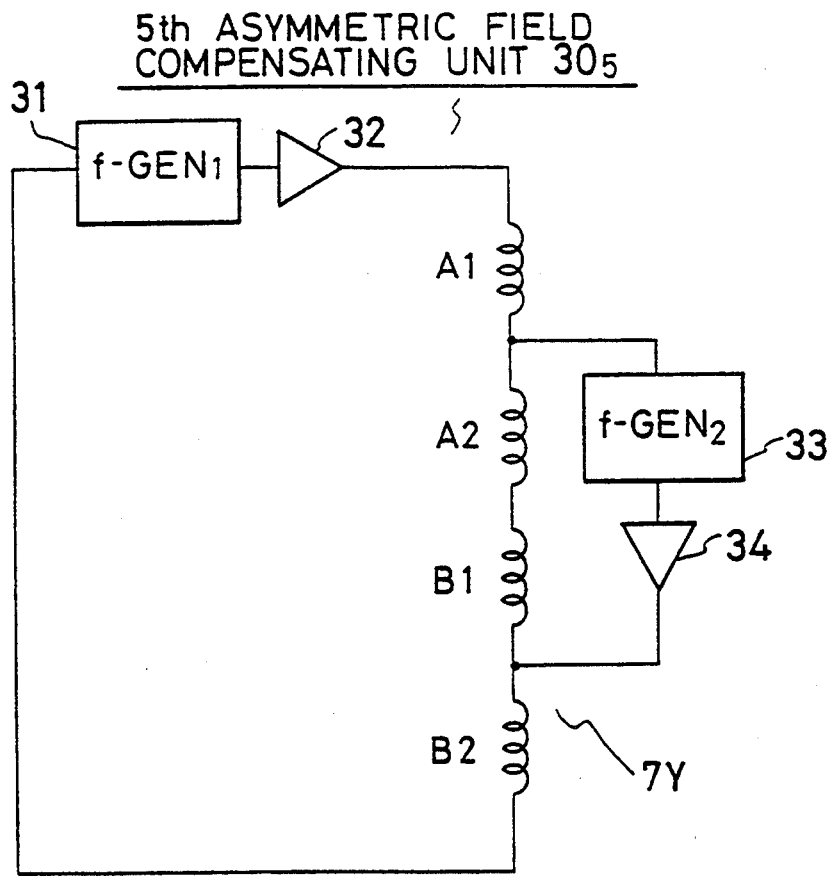
FIG. 19 is a circuit diagram of a fifth asymmetric field compensating unit $30_5$.
Figure 20:
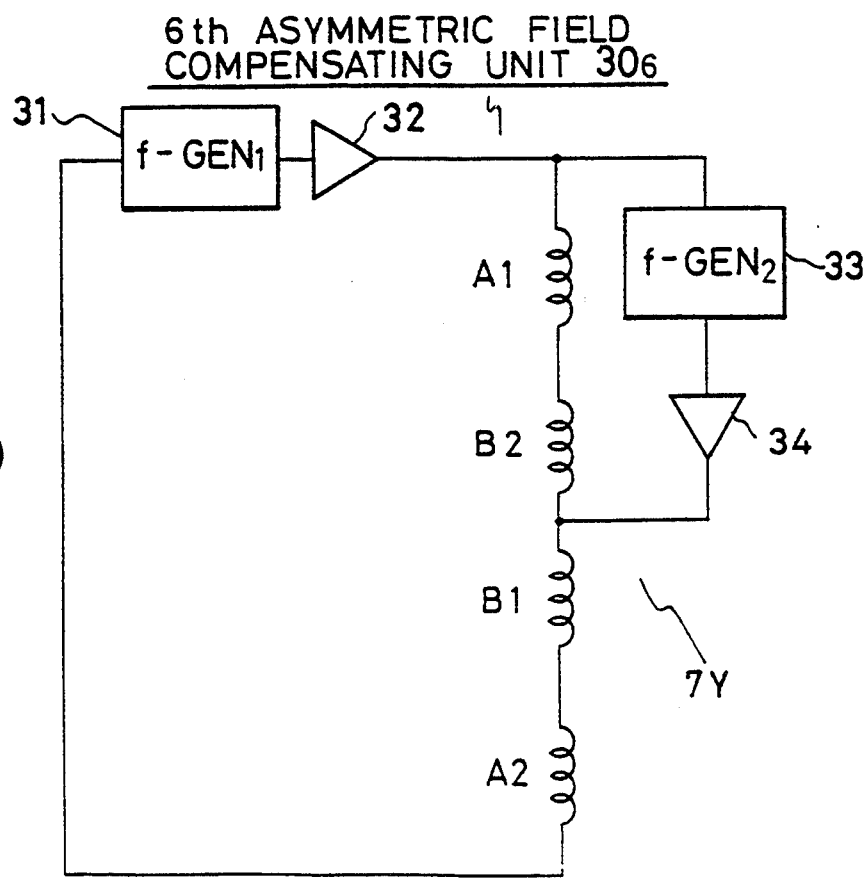
FIG. 20 is a circuit diagram of a sixth asymmetric field compensating unit $30_6$.

Depending upon the asymmetric characteristics of the eddy current fields, other asymmetric field compensating units $30_3$ to $30_5$ may be realized as shown in FIGS. 17, 18 and 19, which belong to the second preferred embodiment of the present invention. As apparent from these circuit diagrams, only 1 coil segment, e.g., A1 is connected to the combination circuit of the arbitrary function generator 33 for correcting the asymmetric field component and the auxiliary constant current source 34 (see FIG. 17), otherwise two coil segments (e.g., A1 and A2) are independently connected to the relevant compensating circuits 33;34 and 33A;34A (see FIG. 18).

Sixth to Seventh Asymmetric Field Compensating Units $30_6$, $30_7$

Figure 21:
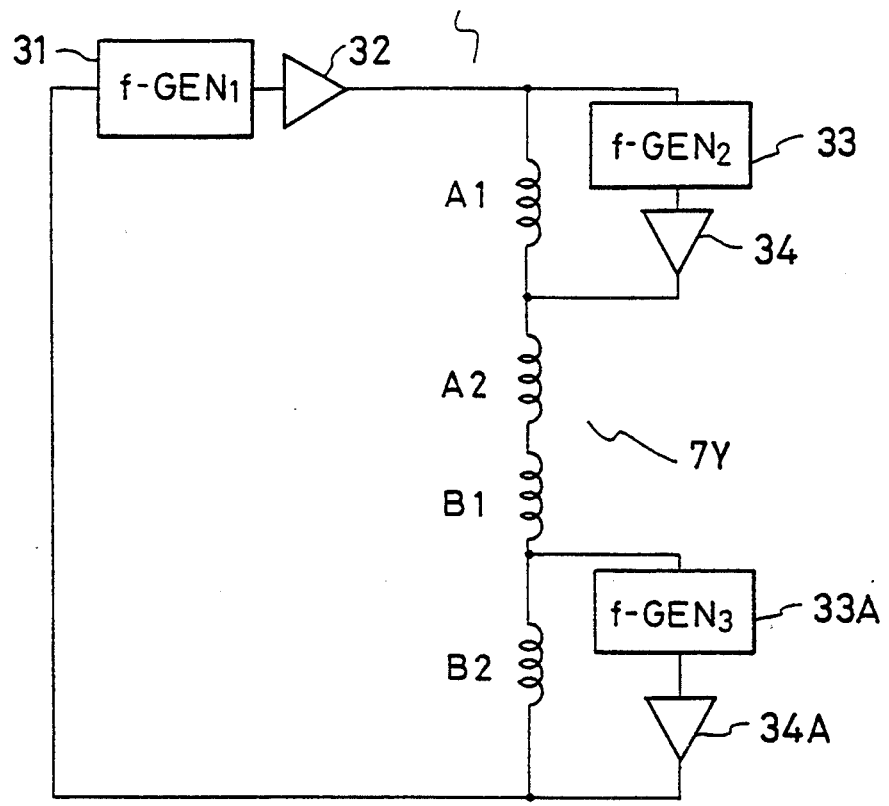
FIG. 21 is a circuit diagram of a seventh asymmetric field compensating unit $30_7$.

To accomplish the first asymmetric field compensating unit $30_1$ shown in FIG. 10, the A-coil segments A1, A2 should be series-connected to the B-coil segments B1, B2. In contrast thereto, when the asymmetric field correcting current is required to be supplied to the different coil segments, e.g., A1 and B2 under the same time constant and the same gain, a sixth asymmetric field compensating unit $30_6$ may be employed, so that only a single compensating circuit arrangement constructed of the arbitrary function generator 33 and the auxiliary constant current source 34 is required. However, if the gradient field coil connection is not changed from that of FIG. 10, two compensating circuit arrangements are required as shown in a seventh asymmetric field compensating unit $30_7$ of FIG. 21.

Modifications of Arbitrary Function Generator 35

Figure 24:
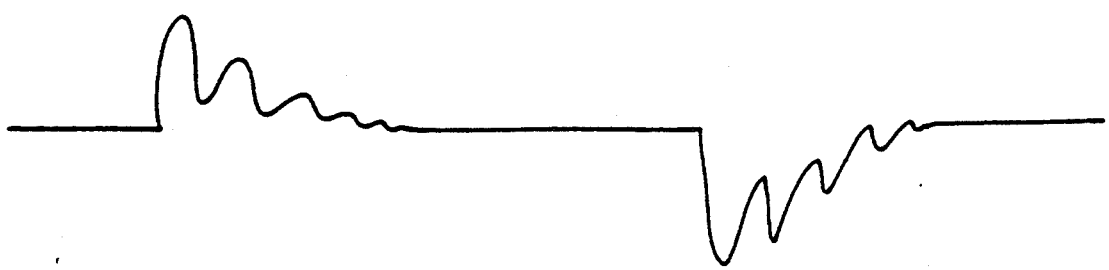
FIG. 24 shows a waveform of a differentiated output from the arbitrary function generator 35.

Although not described in the first asymmetric field compensating unit $30_1$ shown in FIG. 10, the arbitrary function generators 31 and 33 are constructed of the normal RC differentiating circuit (not shown in detail). Alternatively, another arbitrary function generator 35 shown in FIG. 22, or a further arbitrary function generator 37 show in FIG. 24 may be employed instead of these generators 31 and 33.

Figure 22:
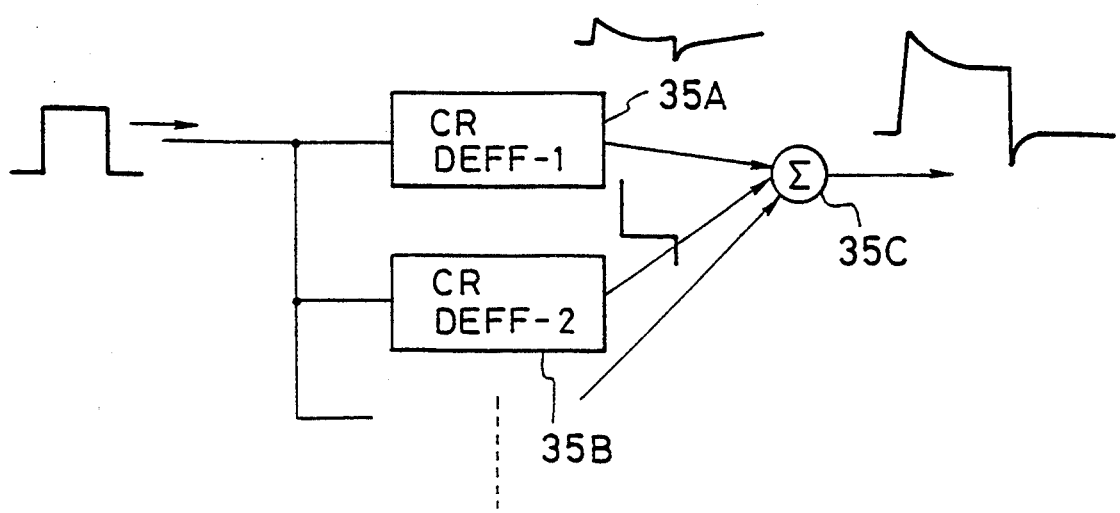
FIG. 22 is a schematic block diagram for showing a first arbitrary function generator 35.
Figure 23:
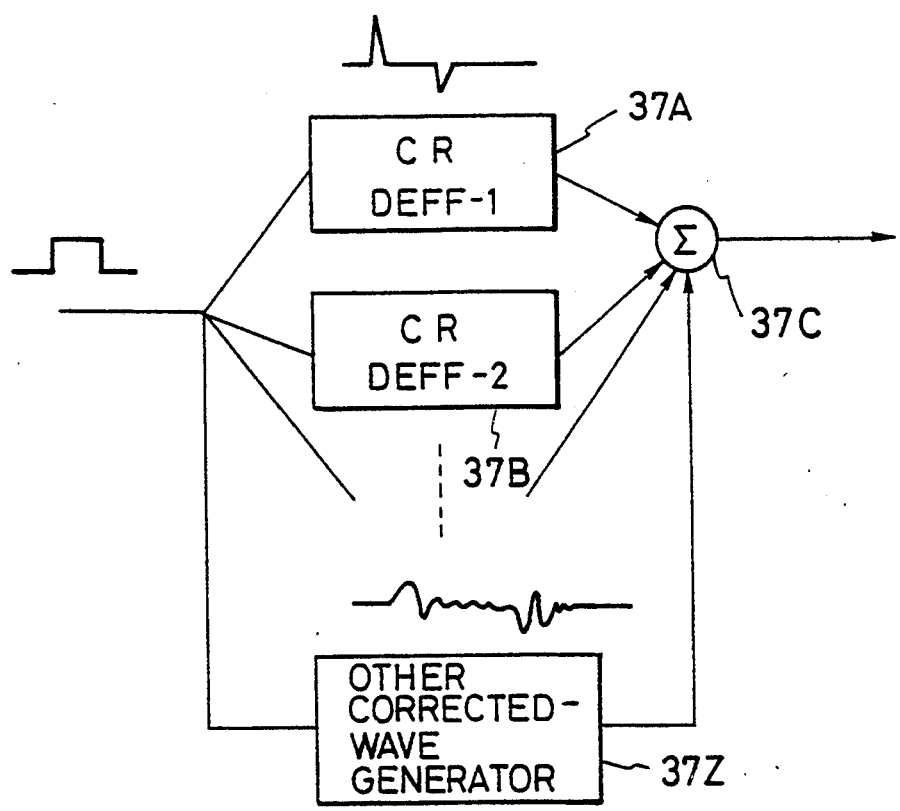
FIG. 23 is a schematic block diagram for showing a second arbitrary function generator 37.

In the arbitrary function generator 35 of FIG. 22, two or more RC differentiating circuits 35A, 35B are connected parallel to each other, and the outputs from these RC differentiating circuits 35A and 35B are summed with each other by an adder 35C, thereby obtaining an arbitrary function output signal as represented in FIG. 22.

Furthermore, another arbitrary function generator 37 may be employed which is constructed of a parallel circuit arrangement of plural differentiating circuits 37A, 37B and other corrected wave generator 37Z, and also an adder 37C. As a result, a waveform for correcting a vibrating field is outputted from the adder 37C (see FIG. 24). This vibrating field is caused by the mechanical vibration of the metal cylinder 35 on which the eddy current is induced, or by the mechanical vibration of the gradient field coil 7.

Other Asymmetric Field Compensating Units

Figure 25:
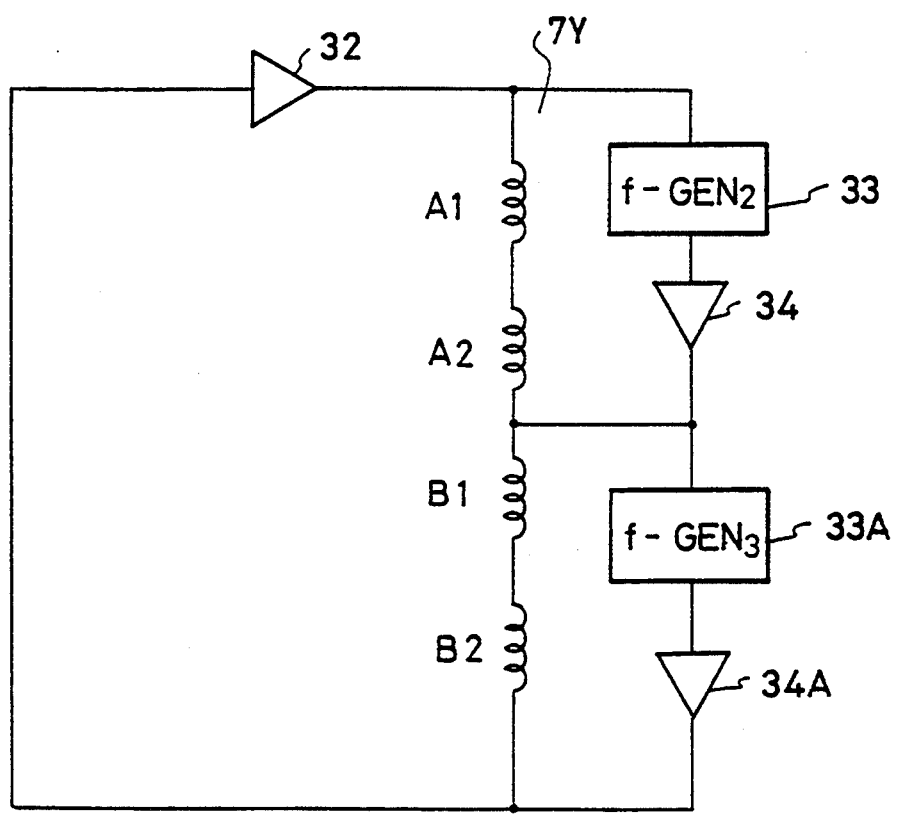
FIG. 25 is a circuit diagram of an eighth asymmetric field compensating unit $30_8$.

In case that the time constants of the eddy current fields become asymmetric with each other in the main magnet, for instance, when a metal cylinder is made of different materials for an upper half portion and a lower half portion, even if a center of this metal cylinder is positioned in a coaxial relationship with the gradient field coil 7, a time constant of an eddy current field induced in the upper half portion is apparently different from that induced in the lower half portion. This is because a resistivity of the upper half portion is different from a resistivity of the lower half portion. Even when such different time constants are corrected, the major arbitrary function generator 31 and the major constant current source 32 are employed to correct the short time constant, and the remaining unbalance component may be corrected by the first asymmetric field compensating unit $30_1$. In this case, as shown in FIG. 25, an eighth asymmetric field compensating unit $30_6$ may be employed. The eighth asymmetric field compensating unit $30_6$ has such a feature that no eddy current compensating current is superimposed in the main constant current source 32, and the gradient coil segments A1, A2, B1 and B2 own separately different time constants and gains. It should be noted that such a difference in the time constants is caused by an unbalanced spatial distribution, and the essential characteristic of the eddy current. If the gains are equal to each other, only a single gain controller is needed.

Among the first to eighth asymmetric field compensating units $30_1$ to $30_6$, both of the arbitrary function generator for correcting the asymmetric field and the auxiliary constant current source are directly connected to the relevant gradient coil segment A1, A2, B1, B2. To the contrary, according to the second basic idea of the present invention, a so-called "separately excited type asymmetric-field compensating unit" may be employed, in which an asymmetric field compensating unit is magnetically coupled to the relevant gradient coil segments.

Figure 26A:
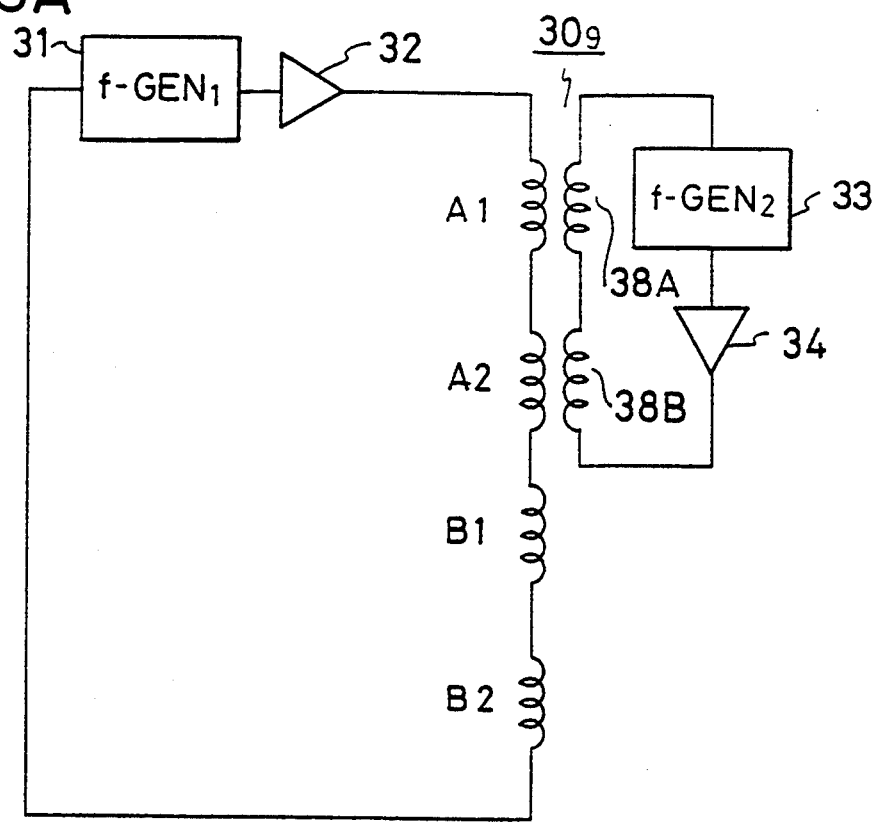
FIG. 26A is a circuit diagram of a ninth asymmetric field compensating unit $30_9$.
Figure 26B:
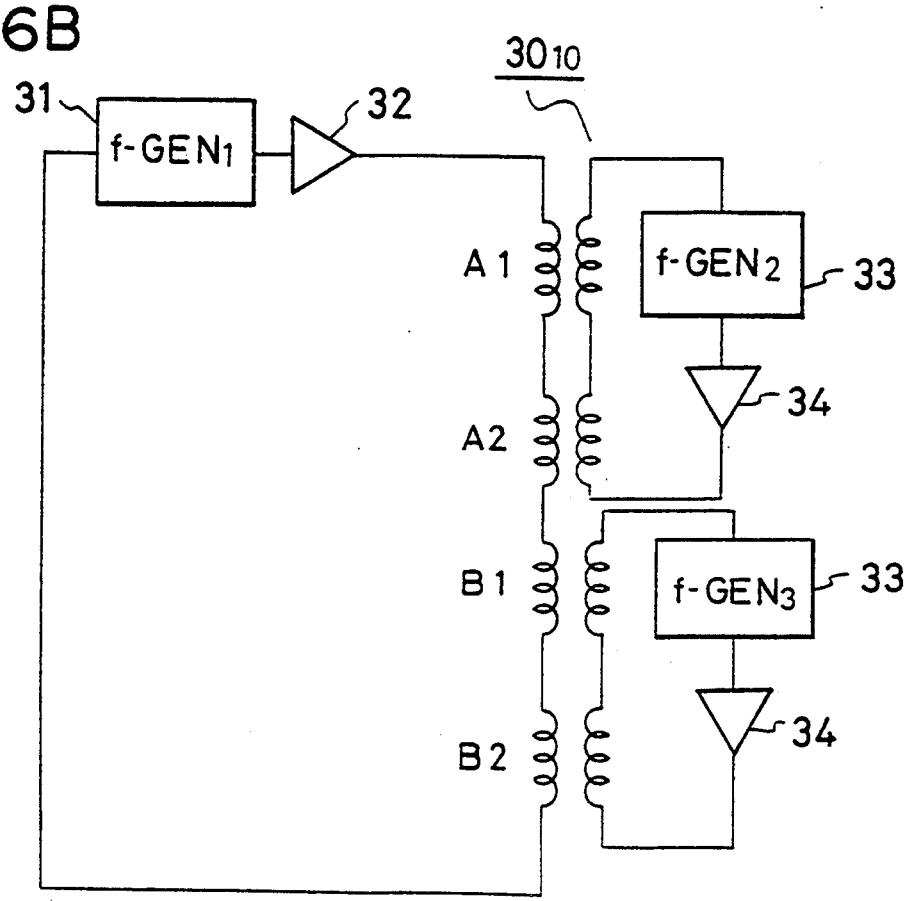
FIG. 26B is a circuit diagram of a tenth asymmetric field compensating unit $30_{10}$.
Figure 26C:
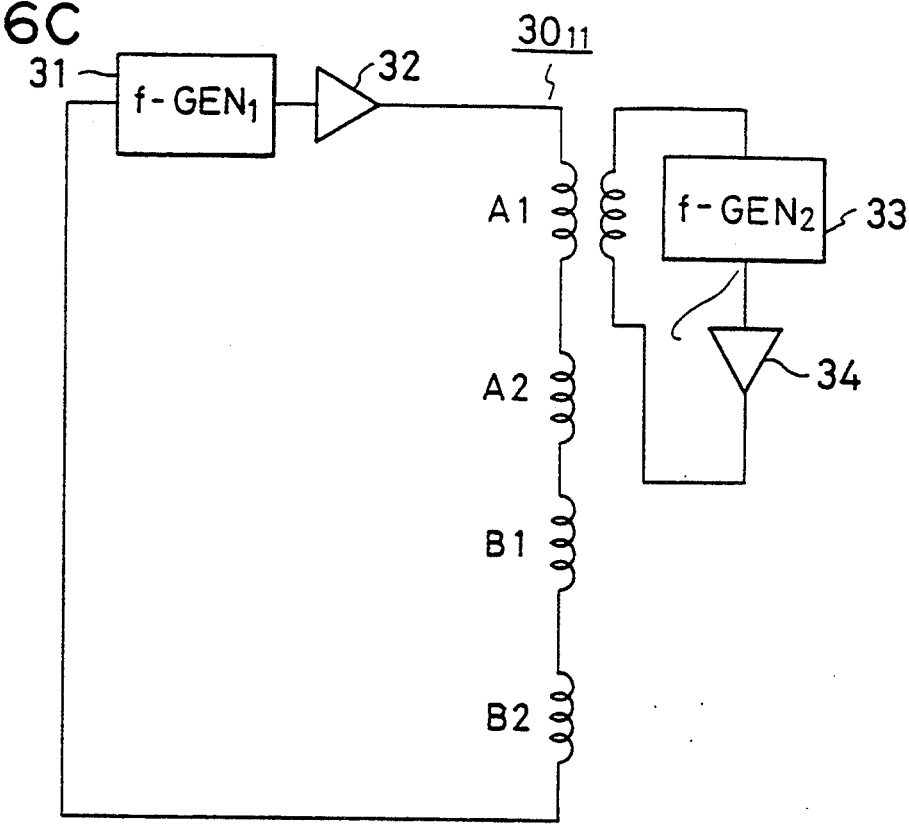
FIG. 26C is a circuit diagram of an 11th asymmetric field compensating unit $30_{11}$.
Figure 26D:
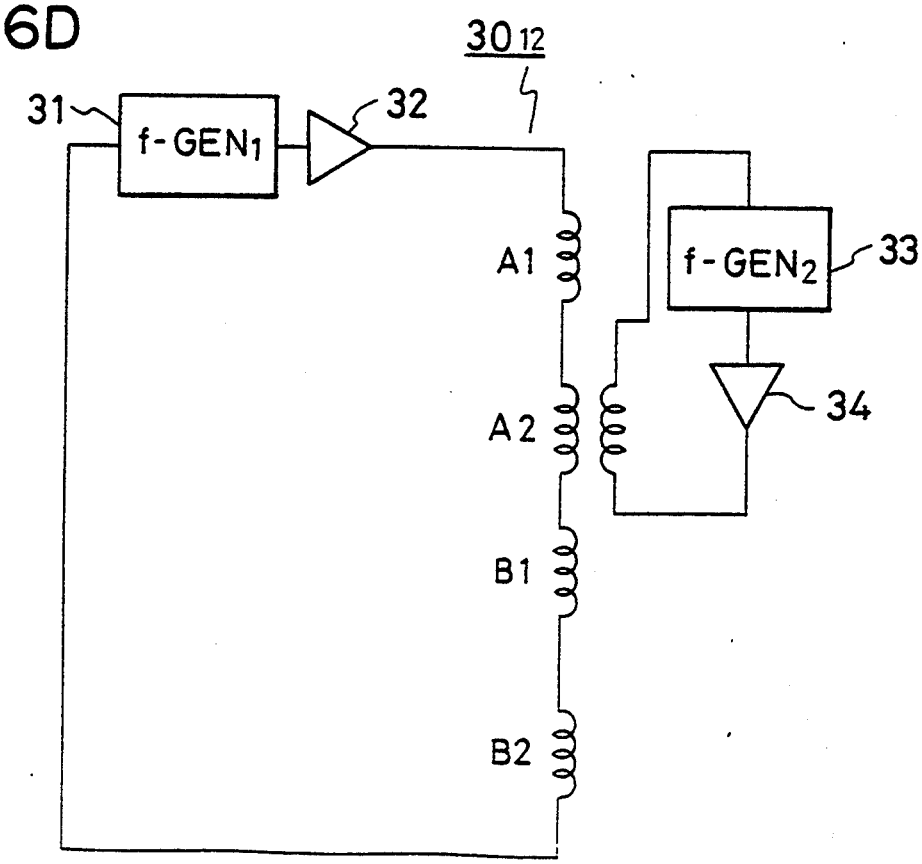
FIG. 26D is a circuit diagram of an 12th asymmetric field compensating unit $30_{12}$.
Figure 26E:
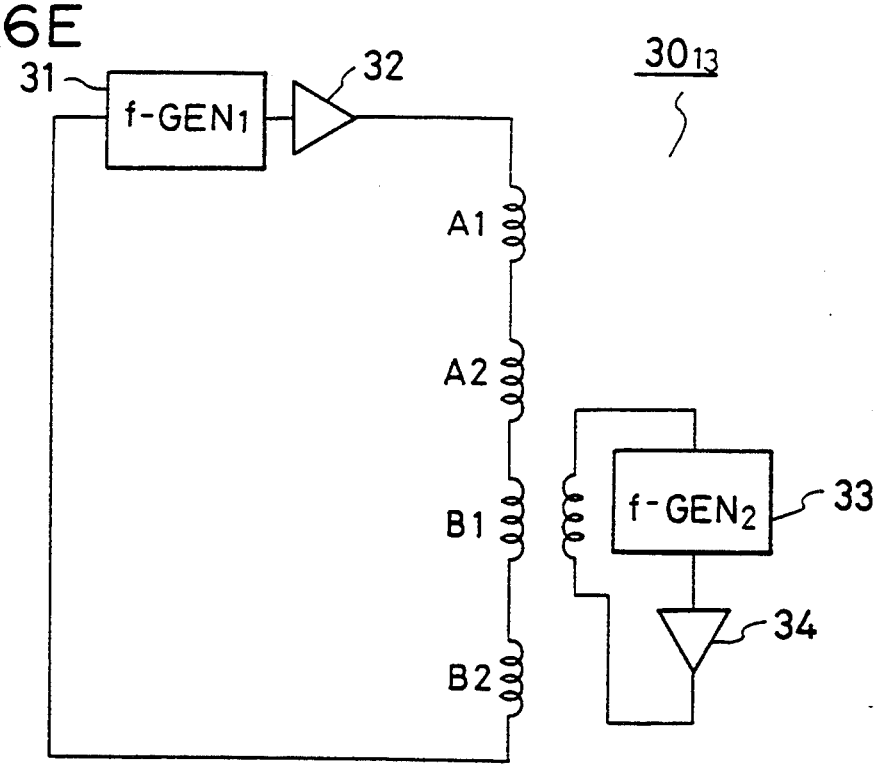
FIG. 26E is a circuit diagram of an 13th asymmetric field compensating unit $30_{13}$.
Figure 26F:
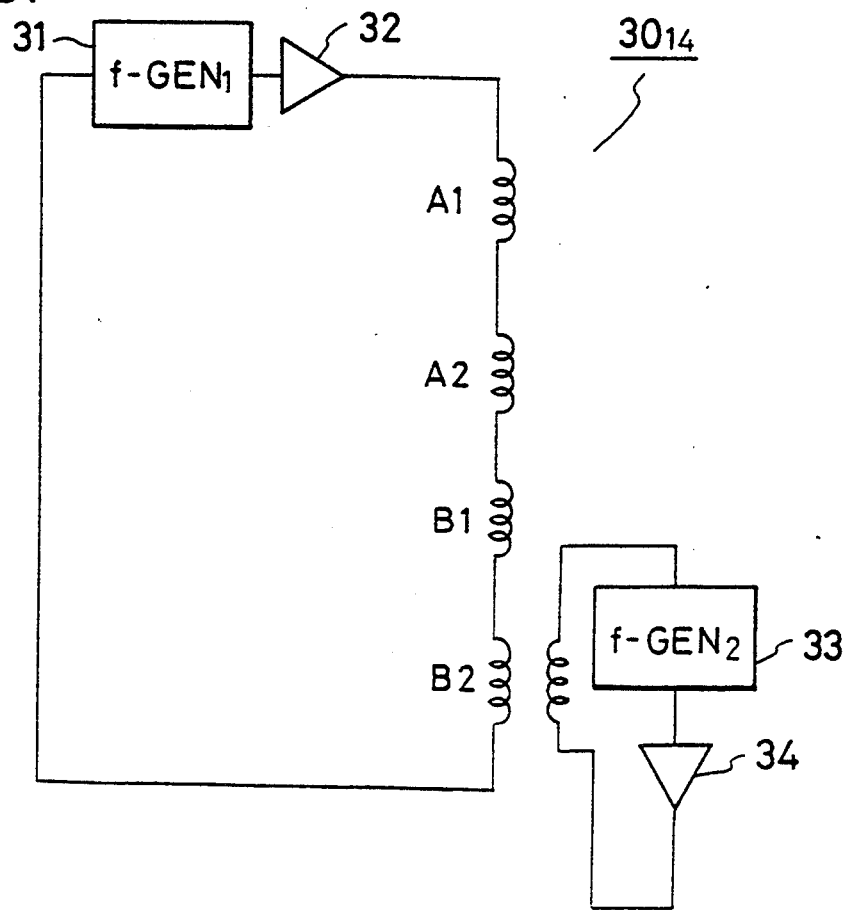
FIG. 26F is a circuit diagram of an 14th asymmetric field compensating unit $30_{14}$.

In FIGS. 26A to 26F, there are represented various examples of the separately excited type asymmetric field compensating units $30_8$ to $30_{14}$. For instance, the separately excited type asymmetric field compensating unit $30_9$ shown in FIG. 26A is magnetically coupled via transformer windings 38A and 38B to the saddle coil segments A1 and A2.

Since the circuit elements of these separately excited type asymmetric field compensating units are well known in the electronic field, no further explanation is made.

Overall Arrangement of Digital Compensating Type MR Imaging System

Figure 27:
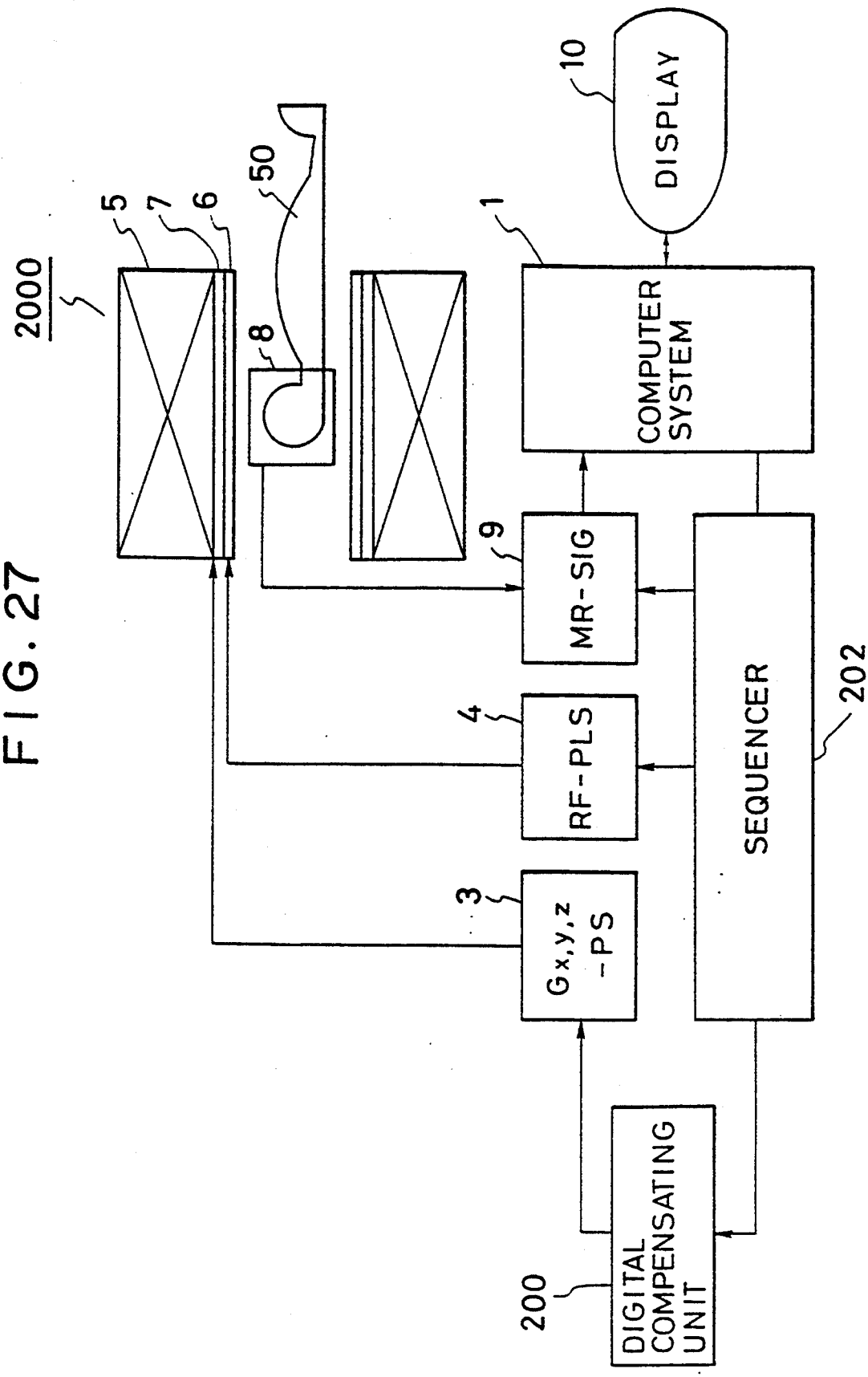
FIG. 27 is a schematic block diagram for showing an entire circuit arrangement of an MR imaging system 2000 including a digital type compensating unit 200, according to a third preferred embodiment of the present invention.

As apparent from the foregoing descriptions, the above-described analog type compensating unit 100 of the first MR imaging system 1000 shown in FIG. 1 may be substituted by a digital type compensating unit 200 of a second MR imaging system 2000 indicated in FIG. 27 in accordance with the present invention. In other words, in the second MR imaging system 2000 according to a third preferred embodiment of the present invention, a digital type compensating unit 200 is newly employed instead of the analog type compensating unit 100, and similarly interposed between the gradient field power source unit 3 and a sequencer 202.

First Digital Type Field Vibration Compensating Unit

Figure 28:
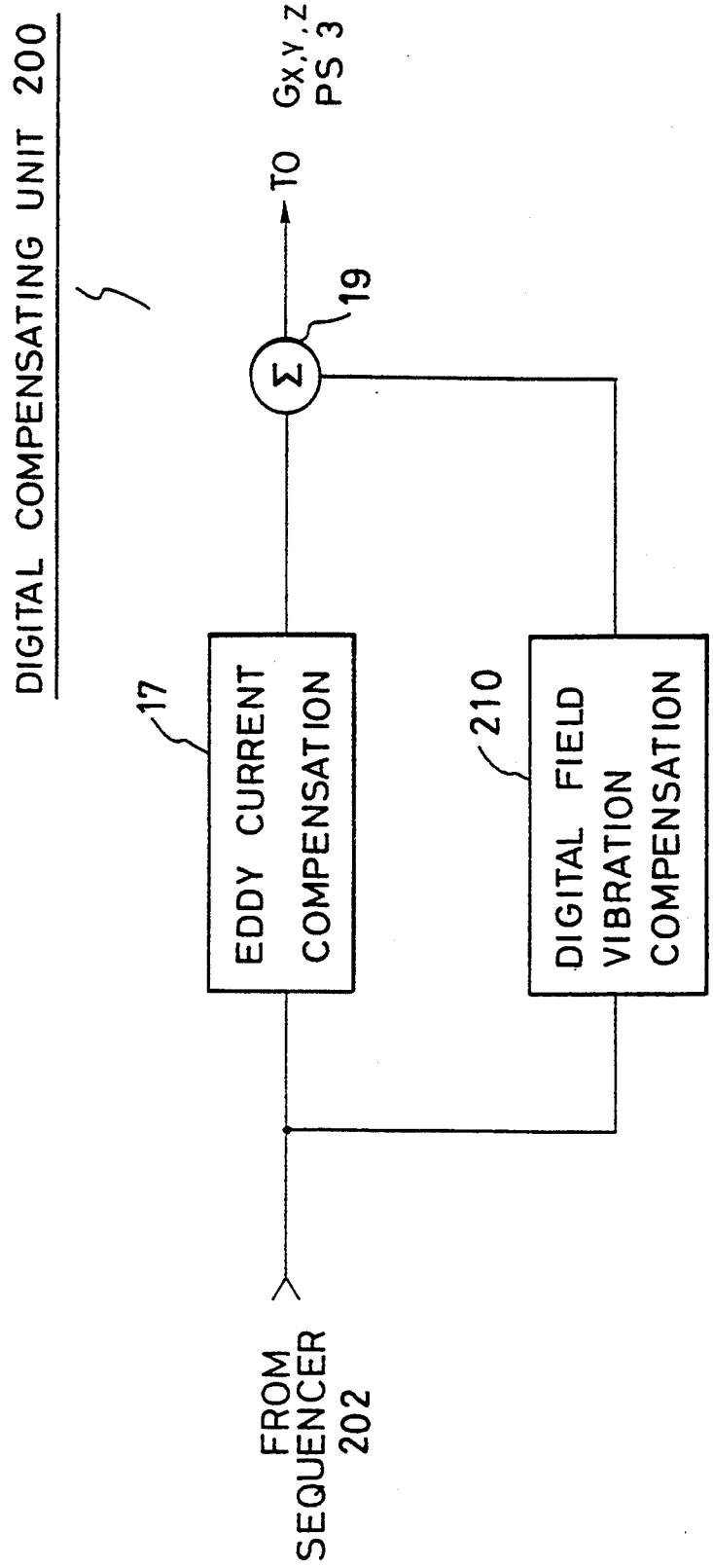
FIG. 28 schematically shows an internal arrangement of the digital compensating unit 200.

The digital type compensating unit 200 is similarly arranged by X-axis, Y-axis, and Z-axis compensating circuits (not shown). Each of these compensating circuits is similarly arranged by the eddy current compensating unit 17, a digital field vibration compensating unit 210, and an adder 19 as represented in FIG. 28.

Figure 29:
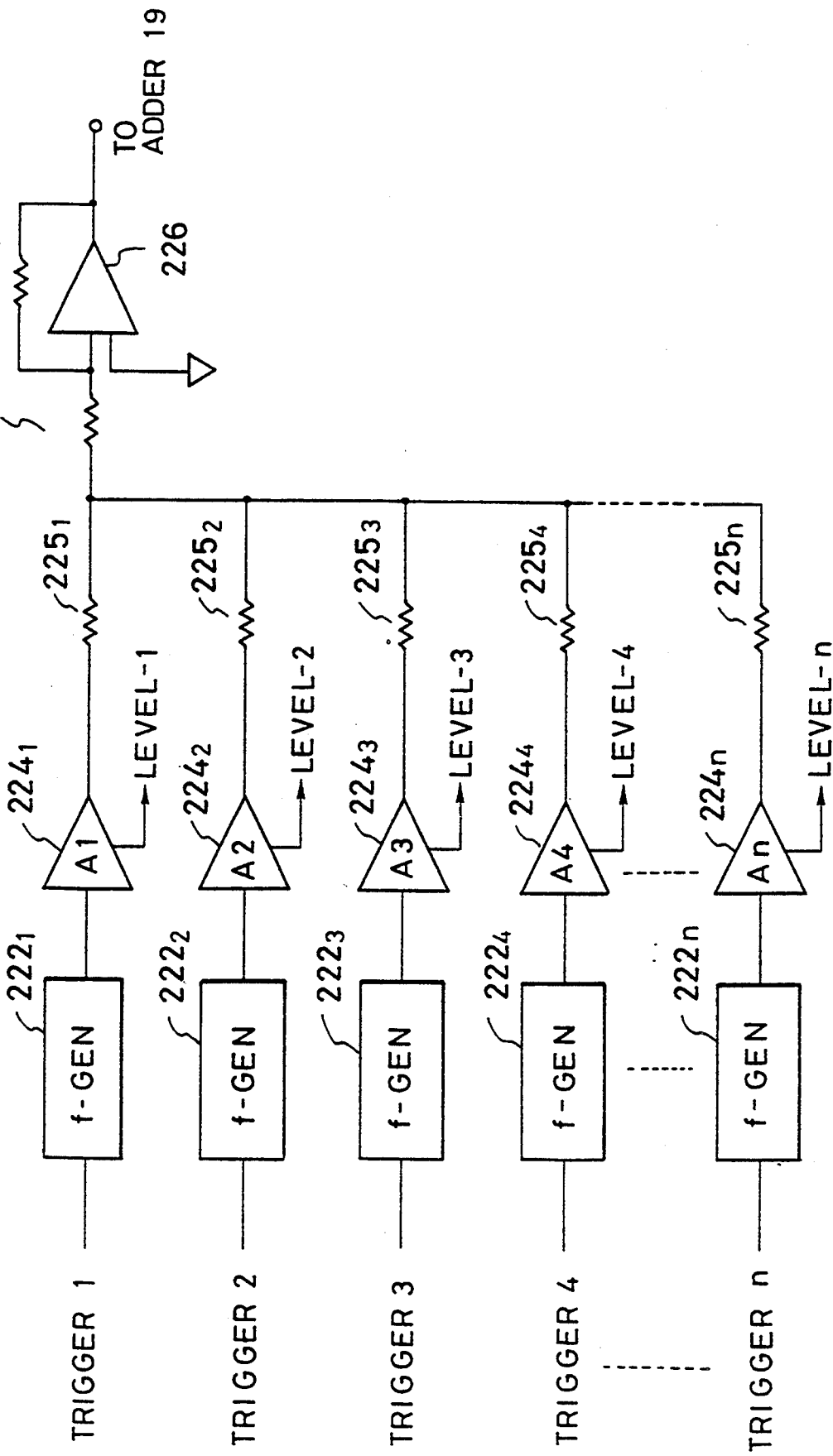
FIG. 29 is a schematic block diagram of a first digital type field vibration compensating unit 220.

Referring now to FIG. 29, a first digital type field vibration compensating unit 220 will be described in detail, which belongs to the third preferred embodiment of the present invention.

This first digital type field vibration compensating unit 220 includes a first circuit arrangement to an n-th ("n" being an integer) circuit arrangement, and an adder 226. Each of these circuit arrangements is constructed of an arbitrary function generator $222_1, \ldots, 222_n$, a variable gain amplifier $224_1, \ldots, 224_n$ and a resistor $225_1, \ldots, 225_n$. These circuit arrangements are connected parallel to each other. The respective arbitrary function generators $222_1$ to $222_n$ receive trigger signals "TRIGGER-1" to "TRIGGER-n" so as to determine the operation timings thereof. The respective variable gain amplifiers $224_1$ to $224_n$ receive level signals "LEVEL-1" to "LEVEL-n" in order to determine amplitudes of the outputs from the arbitrary function generators $222_1$ to $222_n$.

A total number (n) of these arbitrary function generators $222_1$ to $222_n$ is determined as follows. That is to say, in case of MR imaging system, a maximum density of a gradient pulse (rising edge/falling edge numbers per unit time) is determined by a pulse sequence. Assuming now that a time duration of a vibration to be correction is predetermined, the above-described total number of the arbitrary function generator must be selected to be greater than rising edge/falling edge numbers of the pulse appearing within this time duration.

For example, as shown in FIG. 30A and 30C, a total number of rising edge/falling edge of this pulse sequence becomes 8 during a vibration time duration of a pulse current. Under such a circumstances, more than 8 arbitrary function generators 222 are required ("n"≧8).

After this vibration time duration of the pulse current, since the output signal from the first arbitrary function generator $222_1$ becomes 0, a correction signal for a first pulse rising edge after this vibration time duration is produced by $222_1$, and another correction signal for the subsequent pulse falling edge is produced by $222_2$.

Furthermore, a pulse sequence of an MR imaging system produces an arbitrary strength of a gradient field. When the gradient field strength is rised and fallen within a constant time period, it may be predicted that an amplitude of a vibration is proportional to a time variation ratio of the gradient field strength under such a condition that a force is given to a vibration member by way of a mutual effect occurring between an eddy current induced in the vibration member and a static field, whereby a vibration is produced. As a sequence, a gain of a variable gain amplifier 224 is controlled based on a direction and a magnitude of a gradient field to be applied to the patient 50, so that optimum vibrating-field compensation can be achieved.

Although not shown in this drawing, the respective level signals "LEVEL-1" to "LEVEL-n" are produced as follows. A level of a signal derived from the sequencer 202 is detected in a level detector. The detected level of this signal is once held in a corresponding holding circuit. In response to the trigger signal, this level signal is outputted from this holding circuit.

Second Digital Type Field Vibration Compensating Unit

FIG. 31 shows an arrangement of a second digital type field vibration compensating unit 240 belonging to the third preferred embodiment of the present invention, which is so-called as a "sampling" method.

In the second digital type field vibration compensating unit 240, a vibration waveform to be corrected is sensed by a pick-up coil 241 (i.e., sampling operation). A sampled signal is integrated by an integrator 242, and then the integrated sensor signal is A/D-converted by an A/D converter 243 to obtain a digital sensor signal (i.e., vibration data). The vibration data contains a vibration waveform to be corrected. This vibration data is once written into a ROM 244 under control of a CPU 245. Subsequently, under control of CPU 245, the vibration data are read out from ROM 242 in a reverse phase form and then are temporarily stored into RAM $246_1, \ldots, 246_n$.

Thereafter, the vibration data are read out from the relevant RAM $246_1, \ldots, 246_n$, and D/A-converted in D/A converters $247_1, \ldots, 247_n$ to obtain analog vibration signals. Finally, these analog vibration signals are supplied to variable gain amplifiers $248_1, \ldots, 248_n$ so as to be amplified at the relevant gains, and the resultant amplified analog vibration signals are summed with each other, thereby producing a desirable vibration correcting signal.

It should be noted that the vibration correction data acquisition is carried out not only during the control operation, but also such vibration correction data is written into ROM 242, and when a power source of this system is turned ON, these vibration correction data are transferred from ROM 242 to RAM 246, so that the vibration correction may be correctly performed unless the uncorrected vibration component is not changed.

According to the second digital type field vibration compensating unit 240, the following modifications may be realized.

Figure 32A:
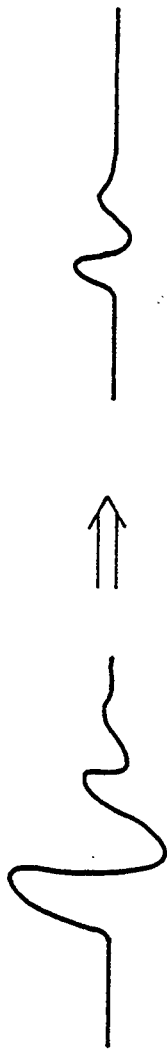
Figure 32B:
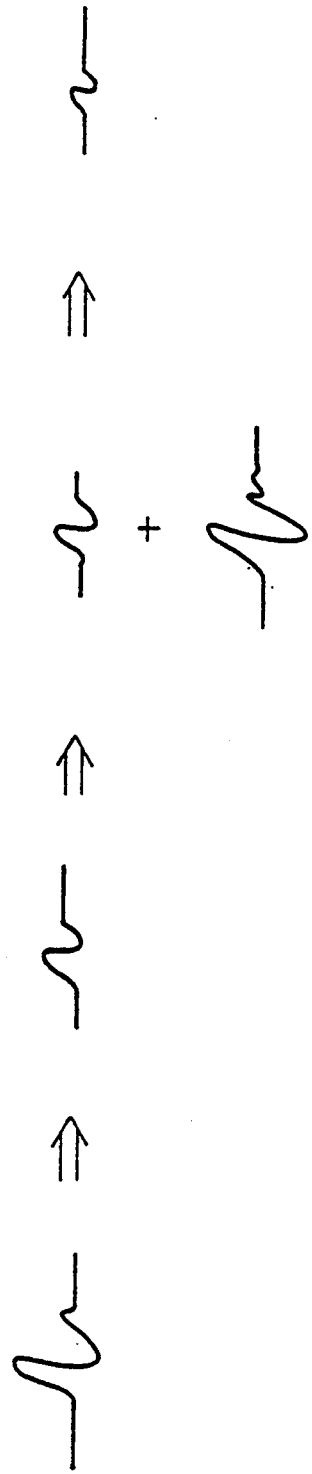

Under control of CPU 245, when the following sequential operation is carried out, a higher vibration correction may be achieved. As illustrated in FIG. 32A, a vibration waveform to be once corrected is sampled to correct this waveform (first correcting method). Also, as shown in FIG. 32B, the data sampling is carried out under such a condition that the waveform correction is once performed, whereby second correcting data is obtained. Thereafter, this second corrected data is added to the first corrected data to finally obtain desirable correction data (second correcting method).

Moreover, the second correcting method is repeated several times in order to improve precision of vibration correcting methods.

In accordance with the above-described first modification, since the correction field is superimposed, the precise correction can be done in such a system having a transfer function parameter by which a vibration field component is newly produced by the correction field component.

As a second modification, the following vibration correcting method may be invented.

As previously described, it may be conceived that a vibrated magnetic component is caused by a vibrated mechanical system. Accordingly, a non-linear characteristic of the vibrated magnetic field may be represented with respect to the field strength or the repetition period, as illustrated in FIGS. 33A and 33B.

In an MR imaging system, a vibrated field component at a read timing may cause adverse influences to a quality of an MR image, e.g., a blurring phenomenon. For instance, in a spin echo method, when a gradient field strength is varied during applications of 90° pulse and 180° pulse, an S/N ratio and the like are deteriorated. In these cases, a range for adversely influencing an image is limited. As a consequence, the vibration correction data obtained by the above-explained sampling method (see FIG. 31) is digital-processed by employing an adaptive filter such as an LMS (Least Mean Square) method, so that the vibrated field strength within the limited range may be lowered and the adverse influence given to the image quality may be eliminated, or suppressed.

Furthermore, another non-linear field component may be produced, because of a difference between a rising edge of a gradient field pulse and a falling edge thereof, which is caused by the mechanical vibrations. In such a case, if the rising edge component and the falling edge component are corrected based upon the correction data sampled at, for instance, the rising edge of the gradient field pulse, a sufficient correction may be expected only at the rising edge portion, but not at the falling edge portion, as illustrated in FIG. 34A and 34B. To solve such a difficulty, two data processing lines of ROM 242 and RAM 246 are employed in the second digital type field vibration compensating unit (see FIG. 31). One data processing line is used to sample the rising edge data, whereas the other data processing line is used to sample the falling edge data.

Digital Asymmetric Field Compensating Unit 300

Figure 35:
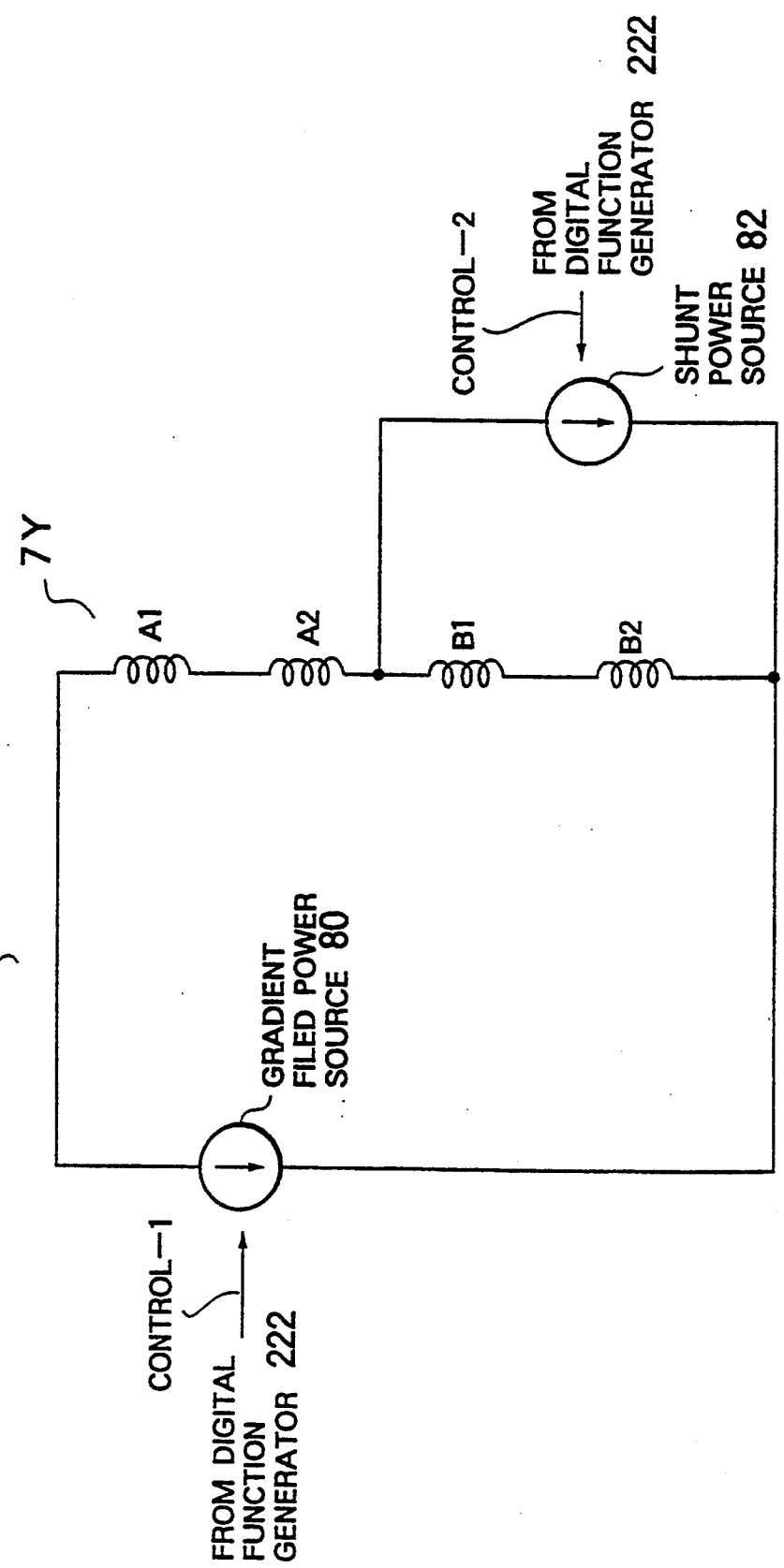
FIG. 35 is a schematic circuit diagram of a digital asymmetric field compensating unit 300 according to a fourth preferred embodiment of the present invention.

Referring now to FIG. 35, a digital asymmetric field compensating unit 300 according to a fourth preferred embodiment of the present invention will be explained.

In FIG. 35, a gradient field power spruce (transconductance amplifier) 80 corresponding to the gradient field power source 3 of FIG. 27 is connected to the Y-axis gradient coil 7Y. Since this gradient field power source 80 receives a first control signal "CONTROL-1" from the digital function generator 222 of FIG. 29, the above-described eddy current field compensating circuit can be superimposed on the Y-axis coil drive current, and thus the superimposed drive current is supplied to this Y-axis gradient coil 7Y.

On the other hand, a shunt power source (transconductance amplifier) 82 corresponding to, for instance, the constant current source 34 shown in FIG. 15 is connected parallel to the coil segments (windings) B1 and B2 of the Y-axis gradient coil 7Y. It should be noted that a power capacity of this shunt current source 82 is considerably smaller than that of the gradient field power source 80, because only a half voltage of the maximum coil voltage applied from the gradient field power source 80 is applied to the coil segments B1 and B2 and a compensating current "Ic" supplied from the shunt power source 82 becomes the same current as a main coil current "Im" from the gradient field power source 80 at the worst condition. In general, this shunt current is equal to approximately 1/5 to 1/50 main coil current.

Since this shunt power spruce 82 receives a second control signal "CONTROL-2" from the digital function generator 222, the above-explained vibrating-field compensating current "Ic" can be supplied from this shunt power source 82 to the coil segments B1 and B2, so that the vibrated Y-axis gradient field can be compensated by this compensating current "Ic".

It should be understood that as apparent from the basic idea of the present invention, if this digital function generator 222 is substituted by, for example, the analog function generator 31 shown in FIG. 17, this asymmetric field compensating unit 300 may be operated in an analog compensating manner.

What is claimed is:

1. A method for imaging a biological body under medical examination in an aircore by applying gradient magnetic fields and RF pulses in a static magnetic field to cause a magnetic resonance (MR) for creating an MR image of said biological body on a plane where said magnetic resonance takes place, said gradient magnetic fields being induced by gradient magnetic field generating means which is driven by a first drive current, wherein an eddy current field compensating current is superimposed on said first drive current in order to compensate the deformation of said gradient magnetic field due to eddy current generated in response to application of said gradient magnetic field, and vibrating-field compensating current is superimposed on said first drive current in order to compensate the deformation of said gradient magnetic field due to vibration of a conductor portion in the vicinity of said aircore.

2. The method of claim 1 wherein said gradient magnetic field generating means comprises a plurality of windings arranged in at least one direction of X-, Y- and Z- directions, and different currents are passed through the respective windings in order to compensate asymmetry of the eddy current in said at lease one direction.

3. A magnetic resonance imaging system for imaging a biological body under medical examination in an aircore:

static magnetic field generating means for applying a static magnetic field to said biological body;

gradient magnetic field generating means for applying gradient magnetic fields in the static magnetic field in response to a first drive current supplied to said gradient magnetic field generating means;

an RF pulse generating means for applying RF pulses in the static magnetic field to cause a magnetic resonance (MR) and the gradient magnetic field; and processing means for receiving magnetic resonance signals caused by said magnetic resonance and reconstructing an MR image of said biological body on a plane where said magnetic resonance takes place, wherein said gradient magnetic field generating means is accompanied by eddy current field compensating means for superimposing an eddy current field compensating current on said first drive current in order to compensate the deformation of said gradient magnetic field due to eddy current generated in response to application of said gradient magnetic field, and said gradient magnetic field generating means is accompanied by a vibrating-field compensating means for superimposing a vibrating-field compensating current on said first drive current in order to compensate the deformation of said gradient magnetic field due to vibration of a conductor portion in the vicinity of said aircore.

4. The system of claim 3 wherein said gradient magnetic field generating means comprises a plurality of windings arranged in at least one direction of X-, Y- and Z- directions, and different currents are passed through the respective windings in order to compensate asymmetry of the eddy current in at least one direction.

5. An MR imaging method as claimed in claim 1, wherein said vibrating-field compensating current is produced by differentiating said first drive current 6. An MR imaging method as claimed in claim 1, wherein said vibrating-field compensating current is produced by generating an arbitrary function signal whose amplitude is variable.

7. An MR imaging method as claimed in claim 1, wherein said vibrating-field compensating current is produced by sampling a vibrated gradient field component to obtain vibrating-field correction data.

8. An MR imaging method as claimed in claim 2, wherein said vibrating-field compensating current is produced by generating an arbitrary function signal whose amplitude is variable.

9. An MR imaging method as claimed in claim 2, wherein said vibrating-field compensating current is produced by sampling a vibrated gradient field component to obtain vibrating-field correction data.

10. An MR imaging method as claimed in claim 2, wherein said vibrating-field compensating means includes a differentiating circuit for differentiating said first drive current.

11. An MR imaging system as claimed in claim 10, wherein said vibrating-field compensating means further includes:

a cosine waveform generator for generating a cosine waveform from said first drive current; and a sine waveform generator for generating a sine waveform from said first drive current, both of said cosine waveform generator and said sine waveform generator being connected parallel to said differentiating circuit, whereby said differentiated first drive current is synthesized with both of said cosine waveform and said sine waveform.

12. An MR imaging method as claimed in claim 2, wherein said vibrating-field compensating means includes:
   a plurality of arbitrary function generators for generating a plurality of arbitrary function signals;
   a plurality of variable gain amplifiers for amplifying said plurality of arbitrary function signals at different gains, said plurality of arbitrary function signals amplified at the different gains being summed with each other to obtain the vibration-field compensating current.

13. An MR imaging system as claimed in claim 2, wherein said vibrating-field compensating means includes:
   a sampling circuit for sampling a component of said gradient field vibrated by the eddy current to produce field vibration sampling data;
   data processor for processing said field vibration sampling data to obtain data about said vibration-field compensating current.

14. A magnetic resonance imaging system as claimed in claim 2, wherein said vibrating-field compensating means includes at least:
   a first arbitrary function generator for generating a first arbitrary function signal for compensating an eddy current; and
   a second arbitrary function generator for generating a second arbitrary function signal for compensating the asymmetric gradient fields, said second arbitrary function signal being superimposed on said first arbitrary function within at least said one coil segment.

15. A magnetic resonance imaging system as claimed in claim 14, wherein said vibrating-field compensating means further includes:
   a major constant current source interposed between said first arbitrary function generator and said gradient coil assembly; and
   an auxiliary constant current source interposed between said second arbitrary function generator and said one coil segment.

16. A magnetic resonance imaging system as claimed in claim 15, wherein said vibrating-field compensating means further comprising:
   a transformer for magnetically coupling both of said second arbitrary function generator and said auxiliary constant current source via said at least one coil segment to said first arbitrary function generator and said major constant current source.

17. A magnetic resonance imaging system as claimed in claim 2, wherein said vibrating-field compensating means includes:
   a shunt power source having a first power capacity smaller than a second power capacity of said source means; and
   a digital function generator for generating a digital function signal, whereby said shunt power source supplies said asymmetrically vibrating-field compensating current to said one coil segment of the gradient coil assembly in response to said digital function signal.

* * * * *